(12) United States Patent
Sato et al.

(10) Patent No.: US 11,367,675 B2
(45) Date of Patent: Jun. 21, 2022

(54) METHOD FOR MANUFACTURING SEMICONDUCTOR DEVICE INCLUDING A SEMICONDUCTOR CHIP AND LEAD FRAME

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Katsuya Sato, Yokohama (JP); Kakeru Yamaguchi, Yokohama (JP); Tetsuya Yamamoto, Sagamihara (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 0 days.

(21) Appl. No.: 17/110,437

(22) Filed: Dec. 3, 2020

(65) Prior Publication Data
US 2021/0287969 A1 Sep. 16, 2021

(30) Foreign Application Priority Data

Mar. 16, 2020 (JP) .............................. JP2020-045603

(51) Int. Cl.
*H01L 21/44* (2006.01)
*H01L 21/48* (2006.01)
(Continued)

(52) U.S. Cl.
CPC ........ *H01L 23/49537* (2013.01); *H01L 21/56* (2013.01); *H01L 23/31* (2013.01); *H01L 23/49541* (2013.01); *H01L 2021/6027* (2013.01)

(58) Field of Classification Search
CPC ... H01L 23/49537; H01L 21/56; H01L 23/31; H01L 23/49541; H01L 2021/6027;
(Continued)

(56) References Cited

U.S. PATENT DOCUMENTS

2002/0066962 A1 6/2002 Embong et al.
2011/0095411 A1 4/2011 Herbsommer et al.
(Continued)

FOREIGN PATENT DOCUMENTS

| JP | 3118385 U | 1/2006 |
| JP | 2008-16529 A | 1/2008 |
| JP | 2009-267054 A | 11/2009 |

*Primary Examiner* — Kimberly N Rizkallah
*Assistant Examiner* — Dilinh P Nguyen
(74) *Attorney, Agent, or Firm* — Oblon, McClelland, Maier & Neustadt, L.L.P.

(57) ABSTRACT

A method for manufacturing a semiconductor device includes: fixing a semiconductor chip to a first part of a leadframe; bonding one connector member to a first terminal of the semiconductor chip, a second terminal of the semiconductor chip, a second part of the leadframe, and a third part of the leadframe; forming a sealing member; and separating a first conductive part of the connector member and a second conductive part of the connector member by removing at least a section of the portion of the connector member exposed outside the sealing member, the first conductive part being bonded to the first terminal and the second part, the second conductive part being bonded to the second terminal and the third part.

6 Claims, 26 Drawing Sheets

(51) Int. Cl.
*H01L 23/495* (2006.01)
*H01L 21/56* (2006.01)
*H01L 23/31* (2006.01)
*H01L 21/60* (2006.01)

(58) Field of Classification Search
CPC ......... H01L 23/49524; H01L 23/49551; H01L 23/49562; H01L 24/38; H01L 24/29; H01L 24/32; H01L 24/75; H01L 24/83; H01L 2224/29101; H01L 2224/32013; H01L 2224/32245; H01L 2224/37147; H01L 2224/40; H01L 2224/40106; H01L 2224/40247; H01L 2224/40499; H01L 2224/4099; H01L 2224/75272; H01L 2224/83192; H01L 2224/83801; H01L 2224/84007; H01L 2224/84815; H01L 2224/97; H01L 2924/13055; H01L 2924/13091; H01L 2924/181; H01L 24/84; H01L 24/97; H01L 24/40
USPC .......................................... 257/676; 438/123
See application file for complete search history.

(56) References Cited

U.S. PATENT DOCUMENTS

2015/0262924 A1\* 9/2015 Tiu .................... H01L 23/49586
　　　　　　　　　　　　　　　　　　　257/676
2015/0294924 A1\* 10/2015 Bai ................... H01L 23/49541
　　　　　　　　　　　　　　　　　　　257/676
2019/0326204 A1\* 10/2019 Miura ................ H01L 23/3107

\* cited by examiner

METHOD FOR MANUFACTURING SEMICONDUCTOR DEVICE INCLUDING A SEMICONDUCTOR CHIP AND LEAD FRAME

CROSS-REFERENCE TO RELATED APPLICATIONS

This application is based upon and claims the benefit of priority from the prior Japanese Patent Application No. 2020-045603, filed on Mar. 16, 2020; the entire contents of which are incorporated herein by reference.

FIELD

Embodiments relate to a semiconductor device and a method for manufacturing the same.

BACKGROUND

In a structure of a known semiconductor device, a semiconductor chip can be easily connected to external wiring by providing the semiconductor chip on a die pad and using conductive members to electrically connect from two terminals of the semiconductor chip to two corresponding leadframes. In such a semiconductor device, there are cases where the two conductive members are bonded in a state of approaching each other.

DETAILED DESCRIPTION

In general, according to one embodiment, a method for manufacturing a semiconductor device includes: fixing a semiconductor chip to a first part of a leadframe; bonding one connector member to a first terminal of the semiconductor chip, a second terminal of the semiconductor chip, a second part of the leadframe, and a third part of the leadframe; forming a sealing member to cover the semiconductor chip, a bonding part of the connector member with the first terminal, a bonding part of the connector member with the second terminal, a bonding part of the connector member with the second part, and a bonding part of the connector member with the third part, and leave a portion of the connector member and a portion of the leadframe exposed; and separating a first conductive part of the connector member and a second conductive part of the connector member by removing at least a section of the portion of the connector member exposed outside the sealing member, the first conductive part being bonded to the first terminal and the second part, the second conductive part being bonded to the second terminal and the third part.

In general, according to one embodiment, a semiconductor device includes: a first leadframe; a second leadframe separated from the first leadframe; a third leadframe separated from the first and second leadframes; a semiconductor chip bonded to the first leadframe, the semiconductor chip including a first terminal and a second terminal; a first conductive member bonded to the first terminal and the second leadframe; a second conductive member bonded to the second terminal and the third leadframe; and a sealing member that covers the semiconductor chip, a bonding part between the first terminal and the first conductive member, a bonding part between the second terminal and the second conductive member, a bonding part between the second leadframe and the first conductive member, and a bonding part between the third leadframe and the second conductive member, and leaves a portion of the first leadframe, a portion of the second leadframe, a portion of the third leadframe, an end surface of the first conductive member, and an end surface of the second conductive member exposed.

First Embodiment

First, a first embodiment will be described.

Figure 1:
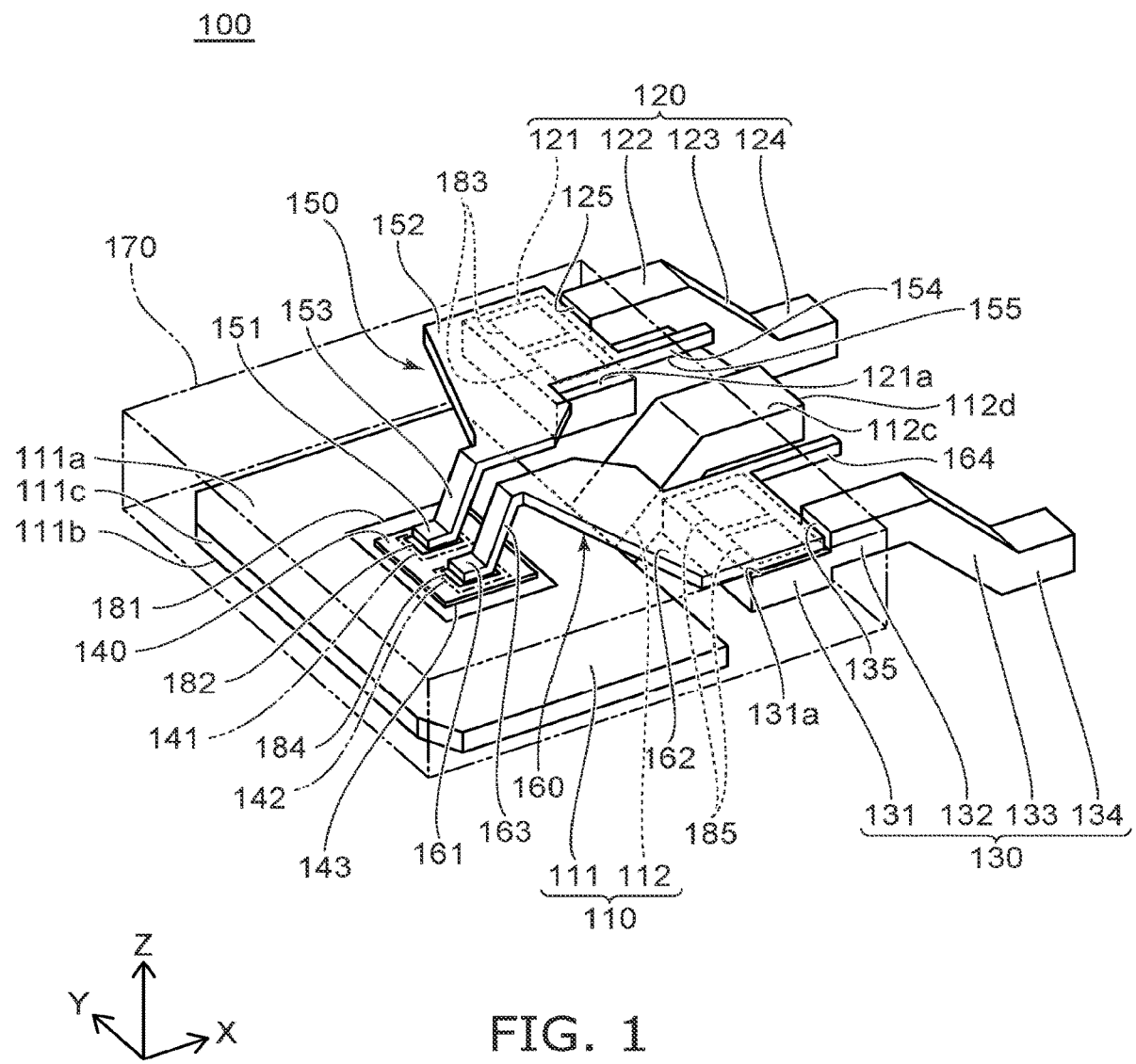
FIG. 1 is a perspective view showing a semiconductor device according to a first embodiment.

FIG. 1 is a perspective view showing a semiconductor device according to the embodiment.

Figure 2:
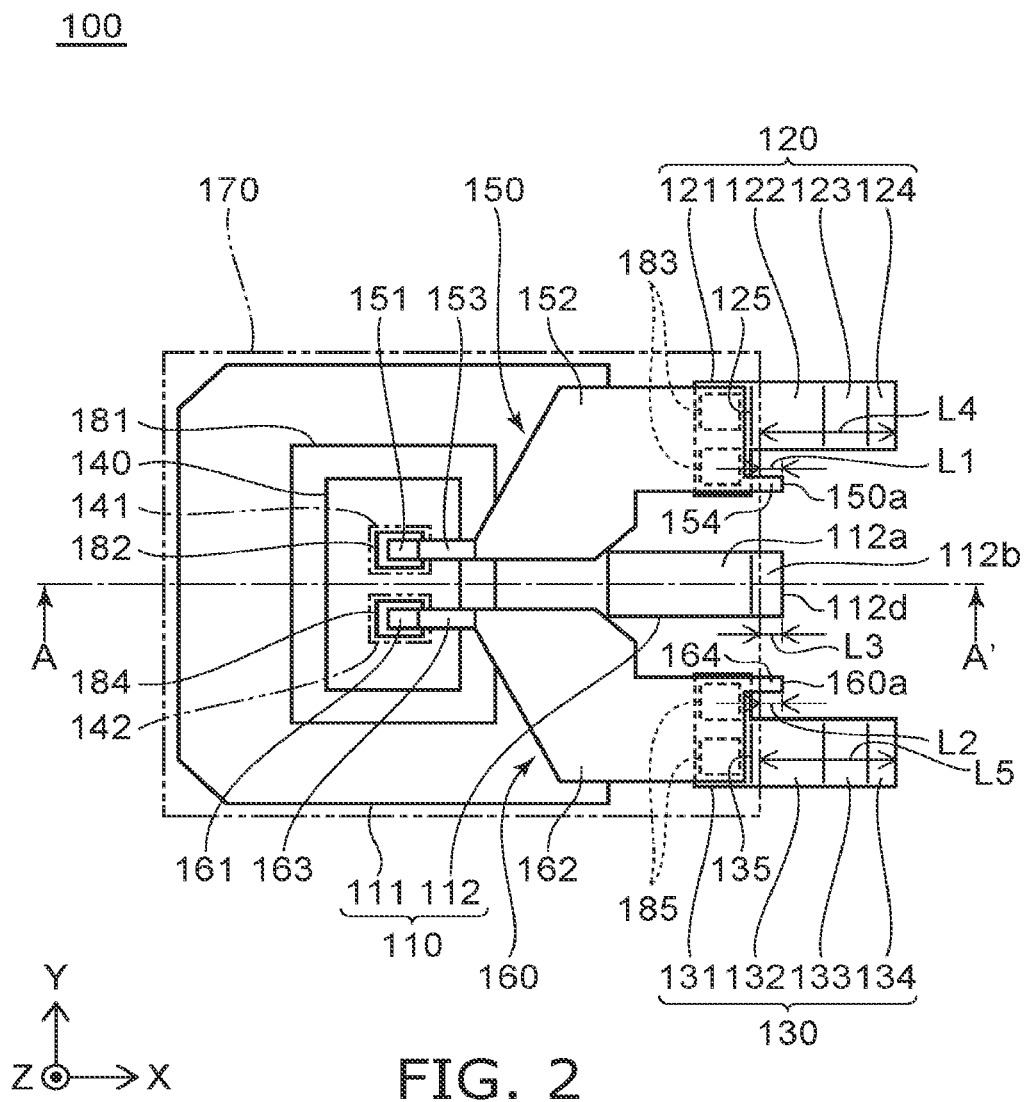
FIG. 2 is a top view showing the semiconductor device according to the first embodiment.

FIG. 2 is a top view showing the semiconductor device according to the embodiment.

Figure 3:
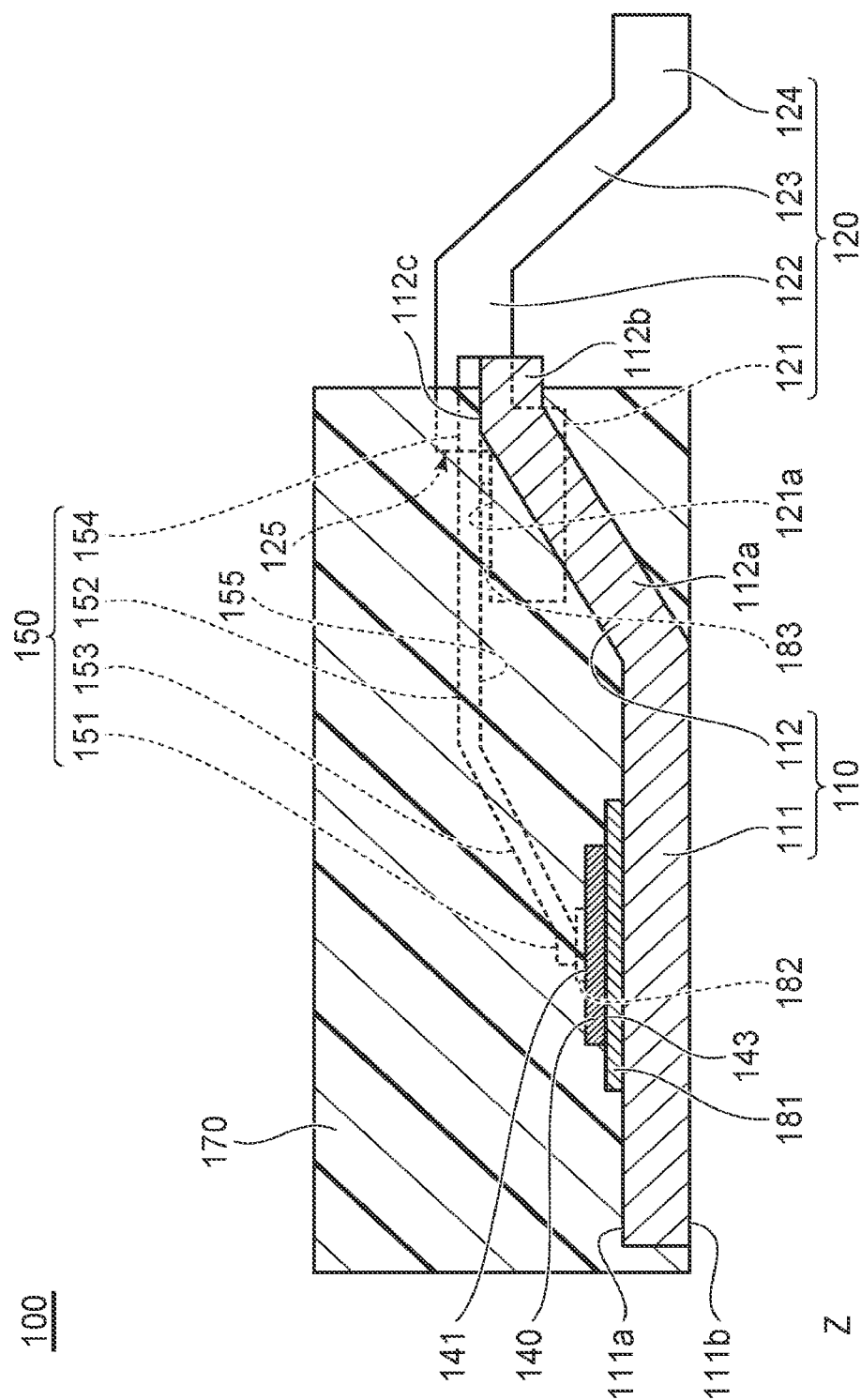
FIG. 3 is a cross-sectional view along line A-A of FIG. 2.

FIG. 3 is a cross-sectional view along line A-A' of FIG. 2.

Generally speaking, as shown in FIG. 1, the semiconductor device 100 according to the embodiment includes a first leadframe 110, a second leadframe 120, a third leadframe 130, a semiconductor chip 140, a first conductive member 150, a second conductive member 160, and a sealing member 170. In some of the drawings, the sealing member 170 is shown by a double dot-dash line for easier understanding of the internal structure of the semiconductor device 100.

The components of the semiconductor device 100 will now be elaborated. An XYZ orthogonal coordinate system is used in the description hereinbelow. As shown in FIGS. 1 to 3, a direction from a main part 111 of the first leadframe 110 toward the semiconductor chip 140 is called a "Z-direction" or an "upward direction". A reverse direction of the upward direction is called a "downward direction". As shown in FIG. 2, a direction that is orthogonal to the Z-direction from the main part 111 toward the second leadframe when viewed in top-view is called an "X-direction". A direction that is orthogonal to the Z-direction and the X-direction from the third leadframe 130 toward the second leadframe 120 is called a "Y-direction".

The first leadframe 110 is made of a conductive material such as copper, etc. As shown in FIGS. 1 and 2, the first leadframe 110 includes the main part 111 and a protruding part 112.

The main part 111 is, for example, a die pad. The main part 111 is plate-shaped. The surfaces of the main part 111 include an upper surface 111a, a lower surface 111b positioned at the side opposite to the upper surface 111a, and a side surface 111c positioned between the upper surface 111a and the lower surface 111b. The upper surface 111a and the lower surface 111b are parallel to the X-direction and the Y-direction.

As shown in FIG. 2, the protruding part 112 protrudes in the X-direction from the main part 111 and is positioned between the second leadframe 120 and the third leadframe 130 when viewed in top-view. As shown in FIG. 3, the protruding part 112 includes a first extension part 112a and a second extension part 112b.

The first extension part 112a is connected to the main part 111. The first extension part 112a extends along a direction oblique to the Z-direction and the X-direction so that the first extension part 112a extends along the Z-direction as the first extension part 112a extends along the X-direction. The second extension part 112b is connected to the first extension part 112a and extends along the X-direction from the first extension part 112a. An upper surface 112c of the second extension part 112b is parallel to the X-direction and the Y-direction. However, the protruding part 112 may not be provided in the first leadframe 110.

The second leadframe 120 is made of a conductive material such as copper, etc. As shown in FIG. 1, the second leadframe 120 is separated from the first leadframe 110. In the embodiment, the second leadframe 120 includes a flat plate part 121, a first extension part 122, a second extension part 123, and a third extension part 124.

The flat plate part 121 is positioned higher than the upper surface 111a of the main part 111. As shown in FIG. 2, the flat plate part 121 is separated from the main part 111 in the X-direction when viewed in top-view. As shown in FIG. 3, an upper surface 121a of the flat plate part 121 is parallel to the X-direction and the Y-direction.

The first extension part 122 is connected to the flat plate part 121 and extends along the X-direction from the flat plate part 121. The first extension part 122 protrudes further upward than the flat plate part 121. Therefore, a step 125 that is upright in the upward direction is formed between the flat plate part 121 and the first extension part 122. The second extension part 123 is connected to the first extension part 122. The second extension part 123 extends along a direction oblique to the X-direction and the Z-direction so that the second extension part 123 extends along the downward direction as the second extension part 123 extends along the X-direction. The third extension part 124 is connected to the second extension part 123 and extends along the X-direction.

The third leadframe 130 is made of a conductive material such as copper, etc. As shown in FIG. 1, the third leadframe 130 is separated from the first leadframe 110. The second leadframe 120 and the third leadframe 130 are arranged in the Y-direction and separated from each other in the Y-direction. In the embodiment, the third leadframe 130 includes a flat plate part 131, a first extension part 132, a second extension part 133, and a third extension part 134.

The flat plate part 131 is positioned higher than the upper surface 111a of the main part 111. As shown in FIG. 2, the flat plate part 131 is separated from the main part 111 in the X-direction when viewed in top-view. As shown in FIG. 1, an upper surface 131a of the flat plate part 131 is parallel to the X-direction and the Y-direction. The upper surface 131a is at substantially the same level as the upper surface 121a of the flat plate part 121 of the second leadframe 120 in the Z-direction.

The first extension part 132 is connected to the flat plate part 131 and extends parallel to the X-direction from the flat plate part 131. The first extension part 132 protrudes further upward than the flat plate part 131. Therefore, a step 135 that is upright in the upward direction is formed between the flat plate part 131 and the first extension part 132. The second extension part 133 is connected to the first extension part 132. The second extension part 133 extends along a direction oblique to the X-direction and the Z-direction so that the second extension part 133 extends along the downward direction as the second extension part 133 extends along the X-direction. The third extension part 134 is connected to the second extension part 133 and extends along the X-direction.

In the embodiment, the semiconductor chip 140 is a MOSFET (Metal-Oxide Semiconductor Field Effect Transistor). The semiconductor chip 140 is disposed on the main part 111 of the first leadframe 110. A conductive bonding member 181 such as solder or the like is provided between the semiconductor chip 140 and the main part 111; and the semiconductor chip 140 and the main part 111 are bonded by the bonding member 181. The semiconductor chip 140 includes a first terminal 141, a second terminal 142, and a third terminal 143.

The first terminal 141 is provided at the upper surface of the semiconductor chip 140. In the embodiment, the first terminal 141 corresponds to a gate electrode. The second terminal 142 is provided at the upper surface of the semiconductor chip 140. In the embodiment, the second terminal 142 corresponds to a source electrode. For example, the first terminal 141 and the second terminal 142 are arranged in the Y-direction.

The third terminal 143 is provided at the lower surface of the semiconductor chip 140. In the embodiment, the third terminal 143 corresponds to a drain electrode. As shown in FIG. 3, the third terminal 143 is electrically connected to the first leadframe 110 via the bonding member 181.

However, the semiconductor chip 140 may not be a MOSFET, and may be an IGBT (Insulated Gate Bipolar Transistor), etc. For example, when the semiconductor chip 140 is an IGBT, the first terminal 141 corresponds to a gate electrode; the second terminal 142 corresponds to an emitter electrode; and the third terminal 143 corresponds to a collector electrode.

As shown in FIG. 1, the first conductive member 150 electrically connects the second leadframe 120 and the first terminal 141 of the semiconductor chip 140. The first conductive member 150 is made of a conductive material such as copper, etc. The first conductive member 150 includes a first part 151, a second part 152, a third part 153, and a fourth part 154.

The first part 151 is disposed on the first terminal 141. A conductive bonding member 182 such as solder or the like is disposed between the first part 151 and the first terminal 141; and the first part 151 and the first terminal 141 are bonded by the bonding member 182.

The second part 152 is provided on the flat plate part 121 of the second leadframe 120. Accordingly, the second part 152 is positioned higher than the first part 151. A conductive bonding member 183 such as solder or the like is disposed between the second part 152 and the flat plate part 121; and the second part 152 and the flat plate part 121 are bonded by the bonding member 183. The second part 152 is plate-shaped.

The third part 153 connects the first part 151 and the second part 152. The third part 153 extends along a direction oblique to the X-direction and the Z-direction.

The fourth part 154 is connected to the second part 152 and extends along the X-direction from the second part 152. As shown in FIG. 2, the fourth part 154 is positioned between the protruding part 112 and the first extension part 122 of the second leadframe 120 when viewed in top-view.

In the embodiment as shown in FIG. 3, the surface of the first conductive member 150 that faces the bonding member 183 (a lower surface 155 of the second and fourth parts 152 and 154) is parallel to the X-direction and the Y-direction. In the Z-direction, the lower surface 155 is positioned slightly higher than the upper surface 121a of the flat plate part 121 of the second leadframe 120 at substantially the same level as the upper surface 112c of the protruding part 112. However, the specific shape of the first conductive member 150 is not limited to that described above.

As shown in FIG. 1, the second conductive member 160 electrically connects the third leadframe 130 and the second terminal 142 of the semiconductor chip 140. The second conductive member 160 is made of a conductive material such as copper, etc. The first conductive member 150 and the second conductive member 160 are arranged in the Y-direction and separated from each other in the Y-direction. The second conductive member 160 includes a first part 161, a second part 162, a third part 163, and a fourth part 164.

The first part 161 is disposed on the second terminal 142. A conductive bonding member 184 such as solder or the like is disposed between the first part 161 and the second terminal 142; and the first part 161 and the second terminal 142 are bonded by the bonding member 184.

The second part 162 is provided on the flat plate part 131 of the third leadframe 130. Therefore, the second part 162 is positioned higher than the first part 161. A conductive bonding member 185 such as solder or the like is disposed between the second part 162 and the flat plate part 131; and the second part 162 and the flat plate part 131 are bonded by the bonding member 185. The second part 162 is plate-shaped.

The third part 163 connects the first part 161 and the second part 162. The third part 163 extends along a direction oblique to the X-direction and the Z-direction.

The fourth part 164 is connected to the second part 162 and extends along the X-direction from the second part 162. As shown in FIG. 2, the fourth part 164 is positioned between the protruding part 112 and the first extension part 132 of the third leadframe 130 when viewed in top-view.

The sealing member 170 is made of a resin material. As shown in FIG. 1, the sealing member 170 is a rectangular parallelepiped in the embodiment. However, the shape of the sealing member 170 is not limited to that described above.

The sealing member 170 seals a bonding part between the first leadframe 110 and the semiconductor chip 140, a bonding part between the first terminal 141 and the first conductive member 150, a bonding part between the first conductive member 150 and the second leadframe 120, a bonding part between the second terminal 142 and the second conductive member 160, and a bonding part between the second conductive member 160 and the third leadframe 130. Specifically, as shown in FIGS. 1 to 3, the sealing member 170 covers the upper surface 111a and the side surface 111c of the main part 111 and the first extension part 112a and one portion of the second extension part 112b of the protruding part 112 of the first leadframe 110. The sealing member 170 also covers the flat plate part 121 and one portion of the first extension part 122 of the second leadframe 120. The sealing member 170 also covers the flat plate part 131 and one portion of the first extension part 132 of the third leadframe 130.

The sealing member 170 leaves a portion of the first leadframe 110, a portion of the second leadframe 120, and a portion of the third leadframe 130 exposed. Specifically, as shown in FIGS. 2 and 3, the sealing member 170 leaves the lower surface 111b of the main part 111 and another portion of the second extension part 112b of the protruding part 112 of the first leadframe 110 exposed. The sealing member 170 also leaves the third extension part 124, the second extension part 123, and another portion of the first extension part 122 of the second leadframe 120 exposed. The sealing member 170 also leaves the third extension part 134, the second extension part 133, and another portion of the first extension part 132 of the third leadframe 130 exposed. The lower surface 111b of the main part 111, the third extension part 124 of the second leadframe 120, and the third extension part 134 of the third leadframe 130 are electrically connected to external wiring when using the semiconductor device 100.

However, the portions of the first leadframe 110, the second leadframe 120, and the third leadframe 130 that are exposed outside the sealing member 170 are not limited to those described above. For example, the sealing member 170 may leave exposed the end portion of the first leadframe 110 in the reverse direction of the X-direction. Also, an end surface 112d of the second extension part 112b of the first leadframe 110 may be coplanar with the side surface of the sealing member 170.

As shown in FIG. 2, the sealing member 170 leaves an end surface 150a of the fourth part 154 of the first conductive member 150 and an end surface 160a of the fourth part 164 of the second conductive member 160 exposed. In FIG. 2, the fourth part 154 of the first conductive member 150 and the fourth part 164 of the second conductive member 160 protrude in the X-direction from the sealing member 170. However, the end surface 150a of the fourth part 154 of the first conductive member 150 and the end surface 160a of the fourth part 164 of the second conductive member 160 may be coplanar with the side surface of the sealing member 170.

As shown in FIG. 2, a dimension L1 along the X-direction of the portion of the first conductive member 150 exposed outside the sealing member 170, a dimension L2 along the X-direction of the portion of the second conductive member 160 exposed outside the sealing member 170, and a dimension L3 along the X-direction of the portion of the protruding part 112 exposed outside the sealing member 170 are substantially the same. A dimension L4 along the X-direction of the portion of the second leadframe 120 exposed outside the sealing member 170 and a dimension L5 along the X-direction of the portion of the third leadframe 130 exposed outside the sealing member 170 are substantially the same. In the embodiment, the dimensions L1, L2, and L3 are less than the dimensions L4 and L5.

A method for manufacturing the semiconductor device 100 according to the embodiment will now be described.

Figure 4:
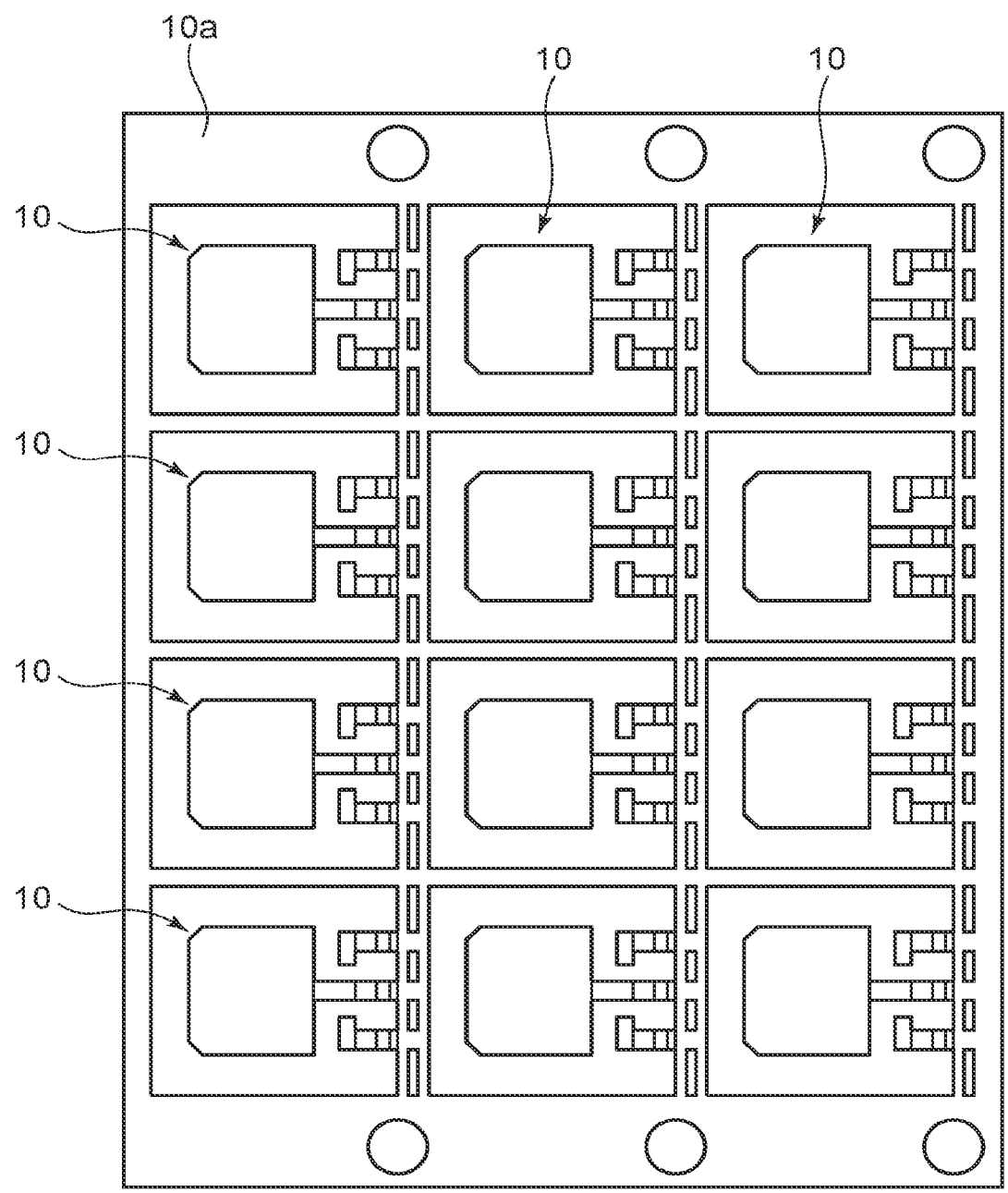
FIG. 4 is a top view showing multiple leadframes used when manufacturing the semiconductor device according to the first embodiment.

FIG. 4 is a top view showing multiple leadframes used when manufacturing the semiconductor device according to the embodiment.

Figure 5:
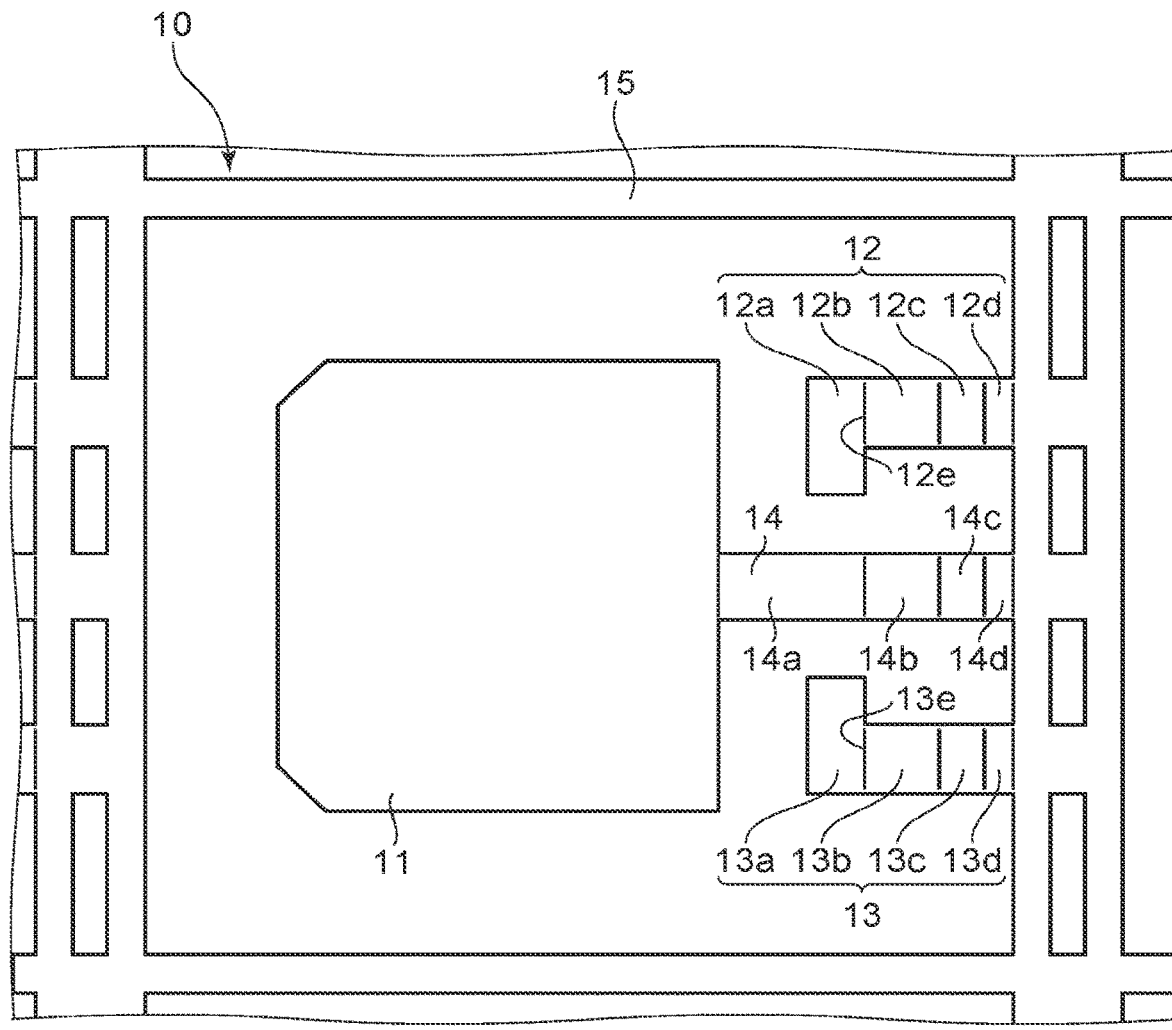
FIG. 5 is an enlarged top view showing one leadframe and the periphery of the leadframe.
Figure 5:
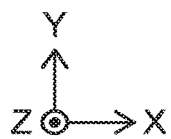

FIG. 5 is an enlarged top view showing one leadframe and the periphery of the leadframe.

Figure 6:
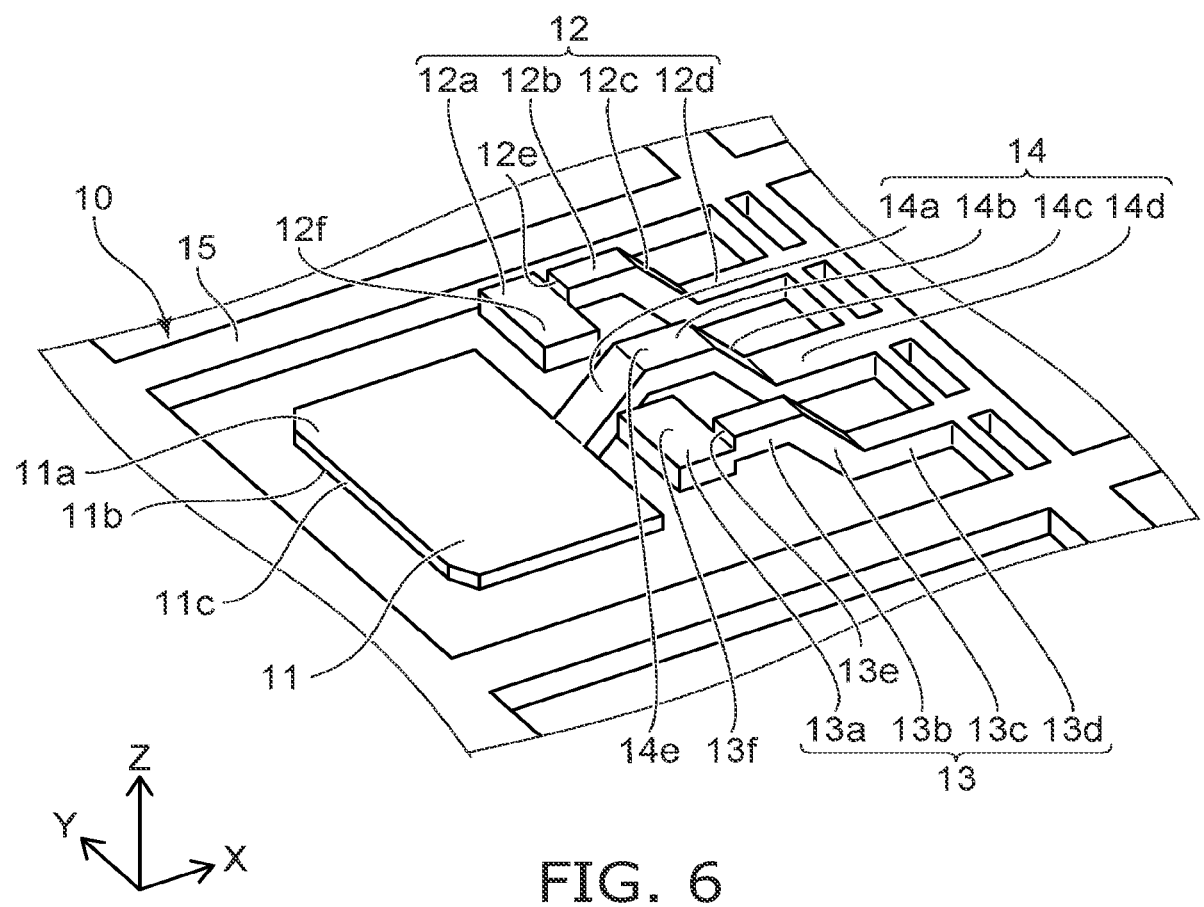
FIG. 6 is a perspective view showing the one leadframe and the periphery of the leadframe.

FIG. 6 is a perspective view showing the one leadframe and the periphery of the leadframe.

First, multiple leadframes 10 are prepared. In the embodiment as shown in FIG. 4, the multiple leadframes 10 are arranged in the X-direction and the Y-direction and are formed to have a continuous body from one conductive member 10a. The manufacturing method will now be described using one leadframe 10 of the multiple leadframes 10. However, the following procedure can be performed for each leadframe 10 of one conductive member 10a.

As shown in FIGS. 5 and 6, the leadframe 10 includes a first part 11, a second part 12, a third part 13, a fourth part 14, and a frame 15 that surrounds these parts when viewed in top-view.

The first part 11 is used to form the main part 111 of the first leadframe 110 in the semiconductor device 100. The first part 11 is plate-shaped. As shown in FIG. 6, the surface of the first part 11 includes an upper surface 11a, a lower surface 11b positioned at the side opposite to the upper surface 11a, and a side surface 11c positioned between the upper surface 11a and the lower surface 11b. The upper surface 11a and the lower surface 11b are parallel to the X-direction and the Y-direction.

At least a portion of the second part 12 is used to form the second leadframe 120 in the semiconductor device 100. The second part 12 is separated from the first part 11. The second part 12 includes a flat plate part 12a, a first extension part 12b, a second extension part 12c, and a third extension part 12d.

As shown in FIG. 5, the flat plate part 12a is separated from the first part 11 in the X-direction when viewed in top-view. As shown in FIG. 6, the flat plate part 12a is positioned higher than the upper surface 11a of the first part 11. An upper surface 12f of the flat plate part 12a is parallel to the X-direction and the Y-direction.

The first extension part 12b is connected to the flat plate part 12a and extends along the X-direction from the flat plate part 12a. The first extension part 12b protrudes further upward than the flat plate part 12a. Therefore, a step 12e that is upright in the upward direction is formed between the flat plate part 12a and the first extension part 12b. The second extension part 12c is connected to the first extension part 12b. The second extension part 12c extends along a direction oblique to the X-direction and the Z-direction so that the second extension part 12c extends along the downward direction as the second extension part 12c extends along the X-direction. The third extension part 12d is connected to the second extension part 12c and the frame 15 and extends along the X-direction.

At least a portion of the third part 13 is used to form the third leadframe 130 in the semiconductor device 100. The third part 13 is separated from the first part 11. The second part 12 and the third part 13 are arranged in the Y-direction and separated from each other. The third part 13 includes a flat plate part 13a, a first extension part 13b, a second extension part 13c, and a third extension part 13d.

As shown in FIG. 5, the flat plate part 13a is separated from the first part 11 in the X-direction when viewed in top-view. As shown in FIG. 6, the flat plate part 13a is positioned higher than the upper surface 11a of the first part 11. An upper surface 13f of the flat plate part 13a is parallel to the X-direction and the Y-direction.

The first extension part 13b is connected to the flat plate part 13a and extends along the X-direction from the flat plate part 13a. The first extension part 13b protrudes further upward than the flat plate part 13a. Therefore, a step 13e that is upright in the upward direction is formed between the flat plate part 13a and the first extension part 13b. The second extension part 13c is connected to the first extension part 13b. The second extension part 13c extends along a direction oblique to the X-direction and the Z-direction so that the second extension part 13c extends along the downward direction as the second extension part 13c extends along the X-direction. The third extension part 13d is connected to the second extension part 13c and the frame 15 and extends along the X-direction.

At least a portion of the fourth part 14 is used to form the protruding part 112 of the first leadframe 110 in the semiconductor device 100. The fourth part 14 includes a first extension part 14a, a second extension part 14b, a third extension part 14c, and a fourth extension part 14d.

The first extension part 14a is connected to the first part 11. The first extension part 14a extends along a direction oblique to the Z-direction and the X-direction so that the first extension part 14a extends along the upward direction as the first extension part 14a extends along the X-direction.

The second extension part 14b is connected to the first extension part 14a and extends along the X-direction from the first extension part 14a. An upper surface 14e of the second extension part 14b is parallel to the X-direction and the Y-direction. The upper surface 14e is positioned slightly higher than the upper surface 12f of the flat plate part 12a of the second part 12 and the upper surface 13f of the flat plate part 13a of the third part 13.

The third extension part 14c is connected to the second extension part 14b. The third extension part 14c extends along a direction oblique to the X-direction and the Z-direction so that the third extension part 14c extends along the downward direction as the third extension part 14c extends along the X-direction.

The fourth extension part 14d is connected to the third extension part 14c and the frame 15 and extends along the X-direction. However, the shape of the leadframe 10 is not limited to that described above. For example, the fourth part 14 may not be provided in the leadframe 10.

Figure 7:
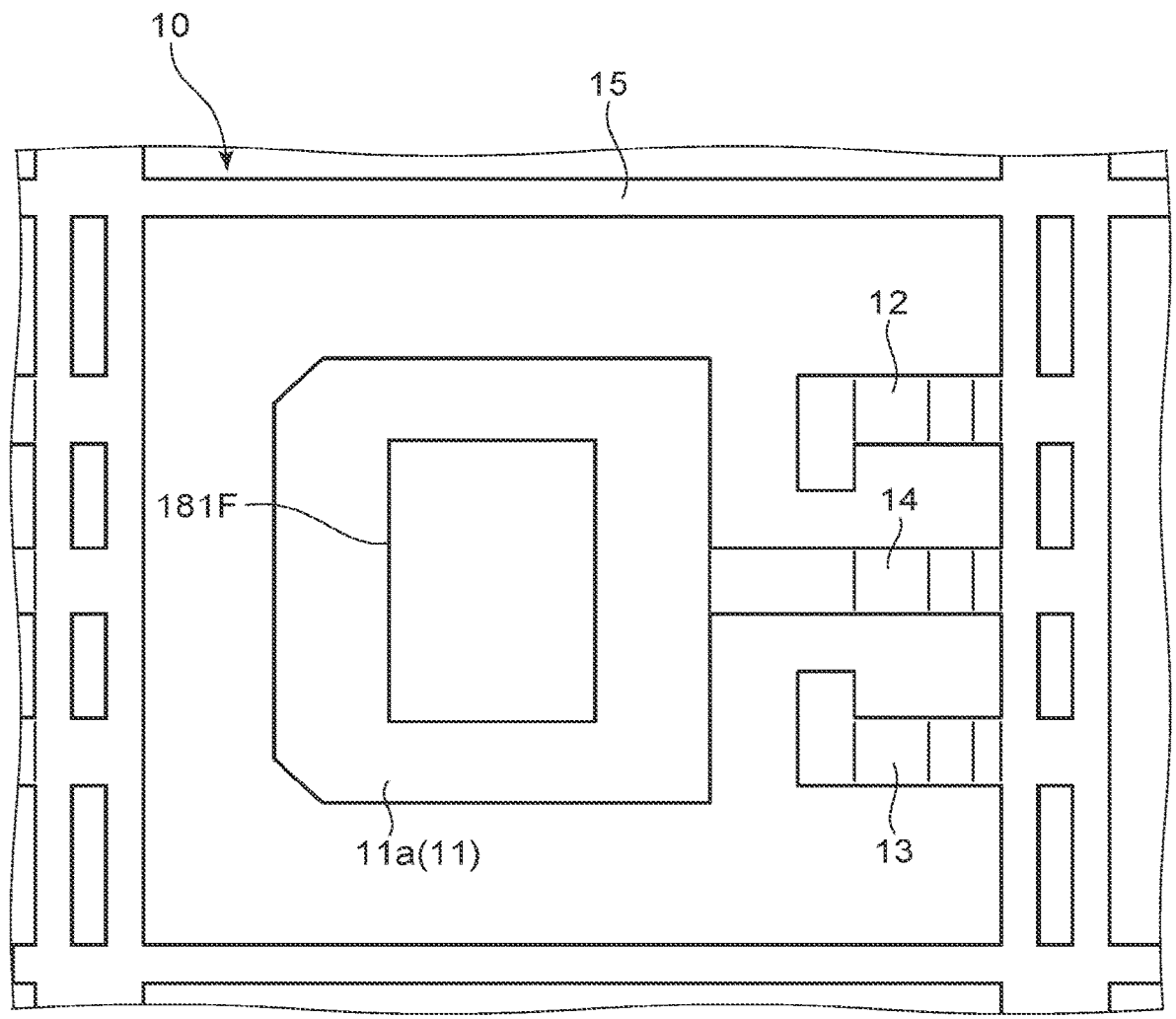
FIG. 7 is a top view showing a method for manufacturing the semiconductor device according to the first embodiment.
Figure 7:
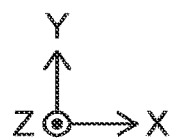
Figure 8:
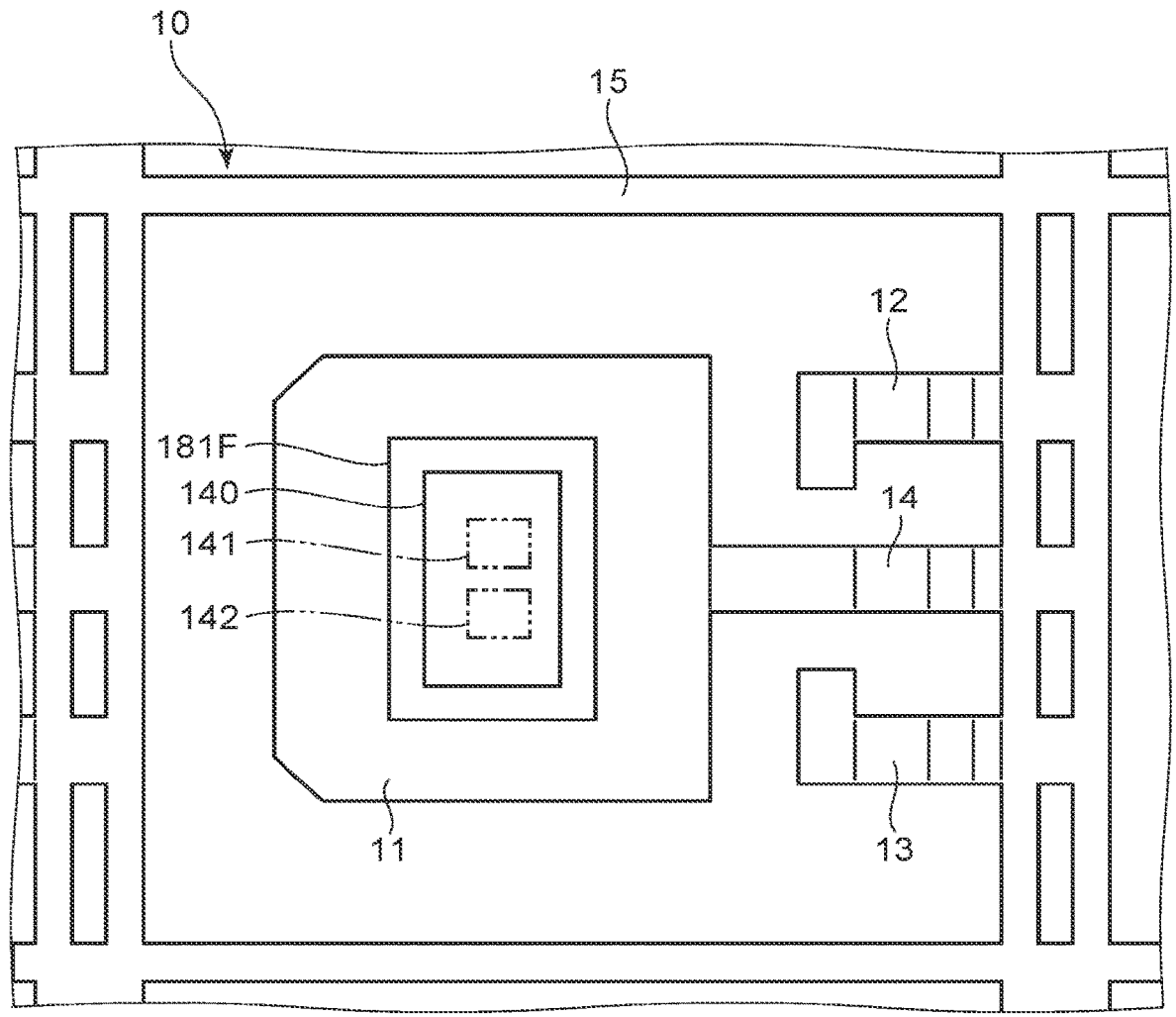
FIG. 8 is a top view showing a method for manufacturing the semiconductor device according to the first embodiment.
Figure 8:
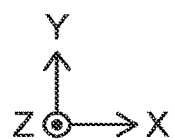
Figure 9:
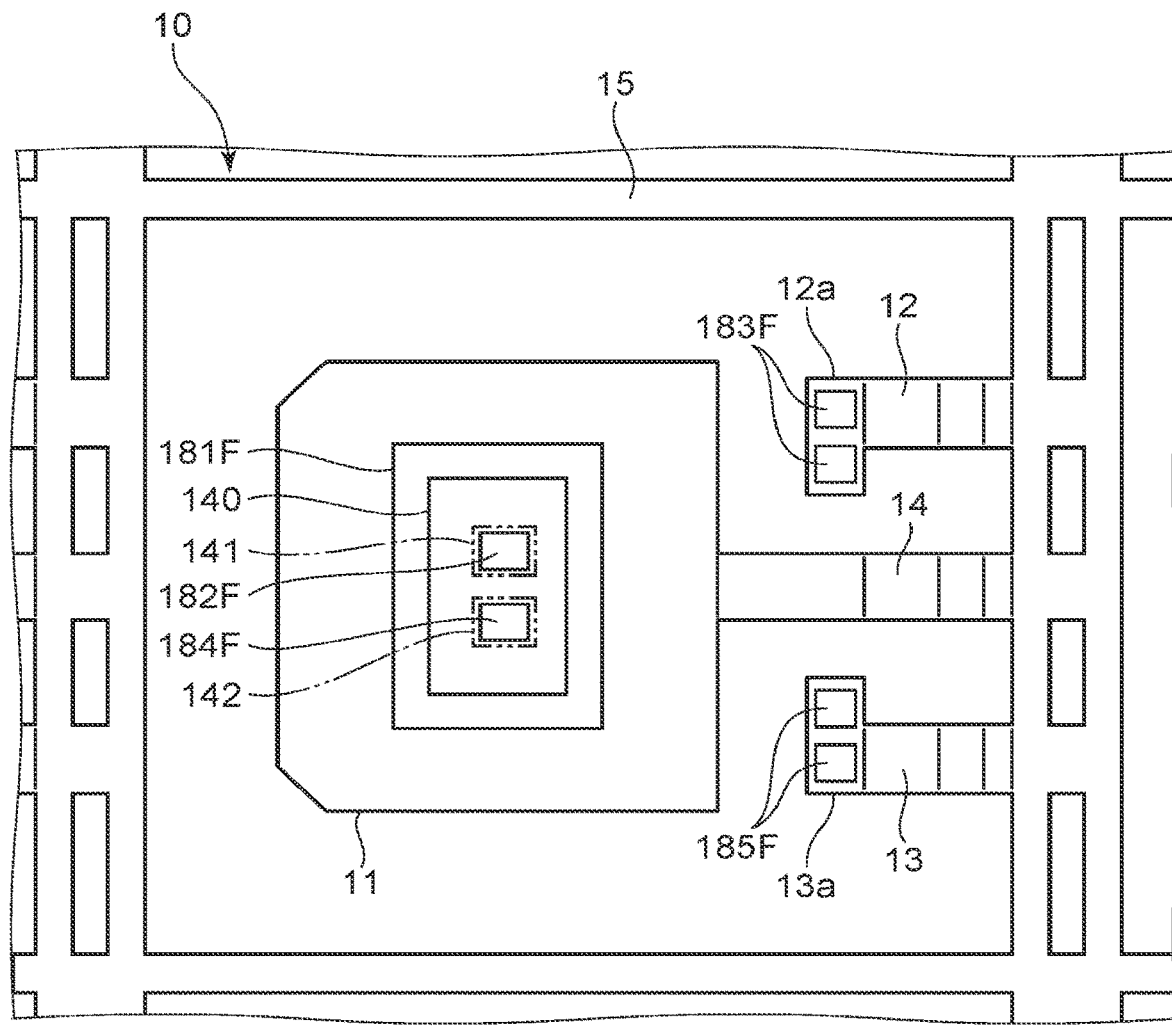
FIG. 9 is a top view showing a method for manufacturing the semiconductor device according to the first embodiment.

FIGS. 7 to 9 are top views showing the method for manufacturing the semiconductor device according to the embodiment.

Then, as shown in FIG. 7, solder 181F before reflow is disposed on the upper surface 11a of the first part 11 of the leadframe 10.

Continuing as shown in FIG. 8, the semiconductor chip 140 is disposed on the solder 181F. The semiconductor chip 140 is fixed thereby to the first part 11. At this time, the semiconductor chip 140 is disposed so that the third terminal 143 faces the first part 11. Thereby, the first terminal 141 and the second terminal 142 are exposed at the upper surface of the semiconductor chip 140.

Then, as shown in FIG. 9, solder 182F before reflow is disposed on the first terminal 141 of the semiconductor chip 140. Solder 184F before reflow is disposed on the second terminal 142 of the semiconductor chip 140. Solder 183F before reflow is disposed on the flat plate part 12a of the second part 12 of the leadframe 10. Solder 185F before reflow is disposed on the flat plate part 13a of the third part 13 of the leadframe 10. The sequence of disposing the solder 182F to 185F is not particularly limited.

Figure 10:
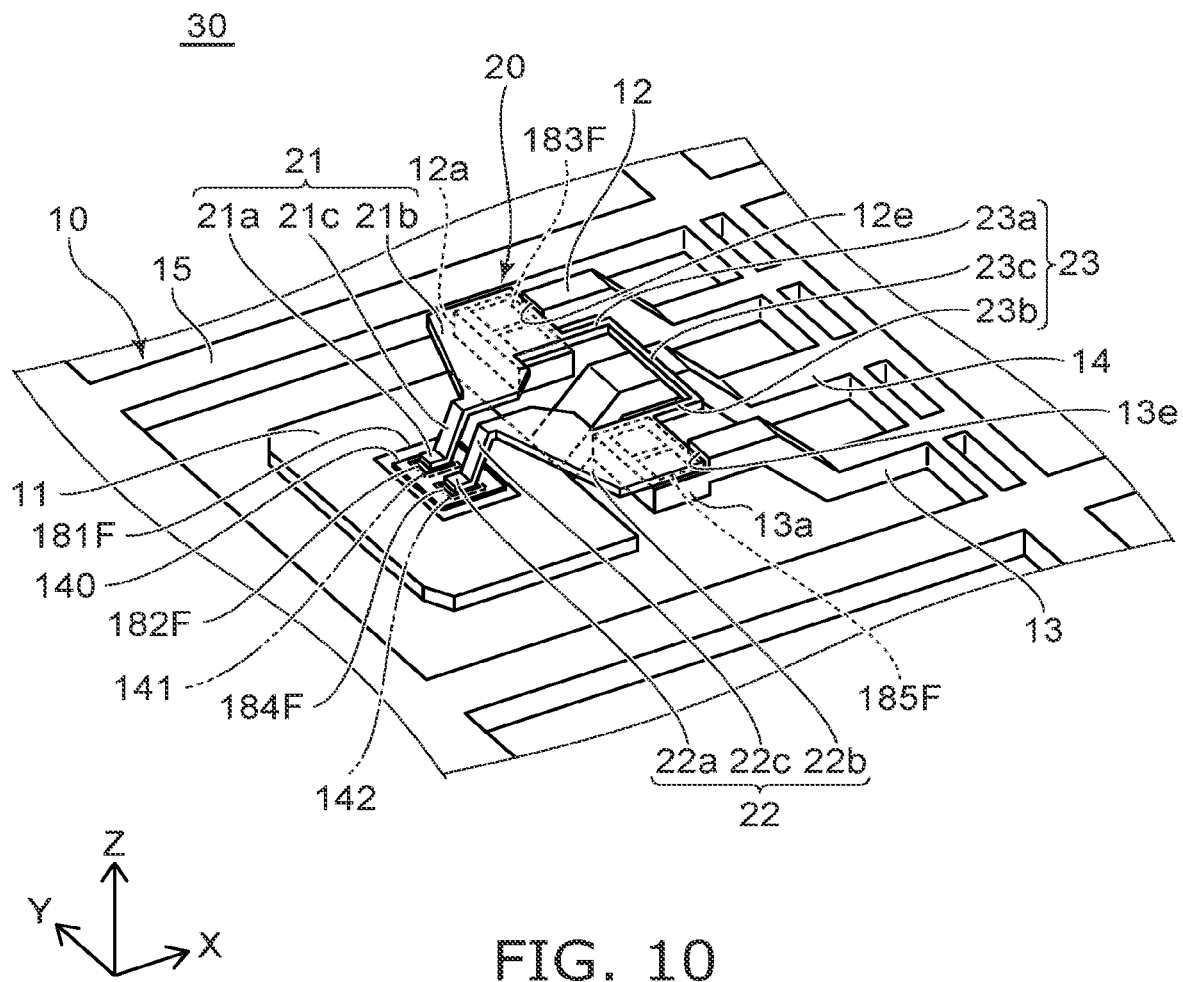
FIG. 10 is a perspective view showing an intermediate body of the method for manufacturing the semiconductor device according to the first embodiment.

FIG. 10 is a perspective view showing an intermediate body of the method for manufacturing the semiconductor device according to the embodiment.

Figure 11:
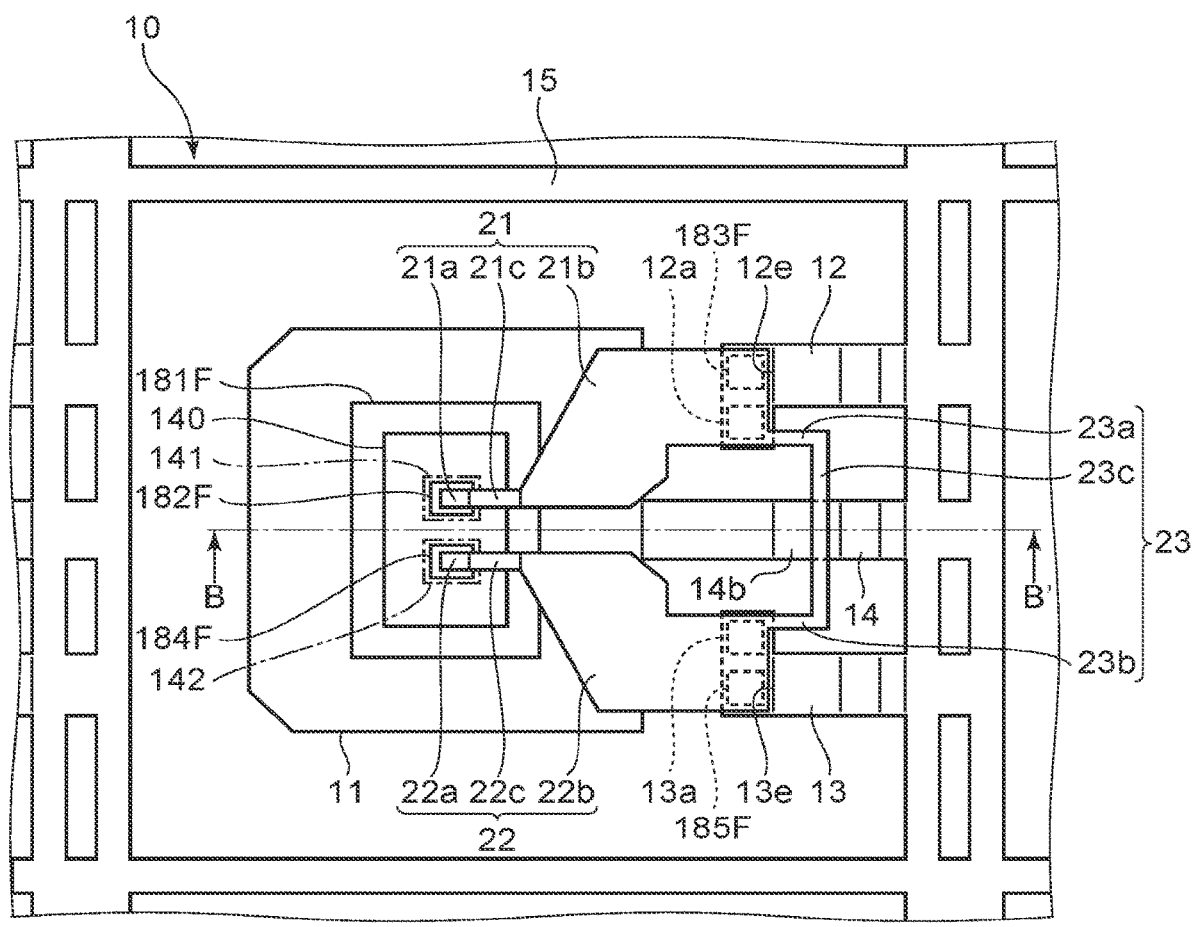
FIG. 11 is a top view showing the intermediate body.

FIG. 11 is a top view showing the intermediate body.

Figure 12:
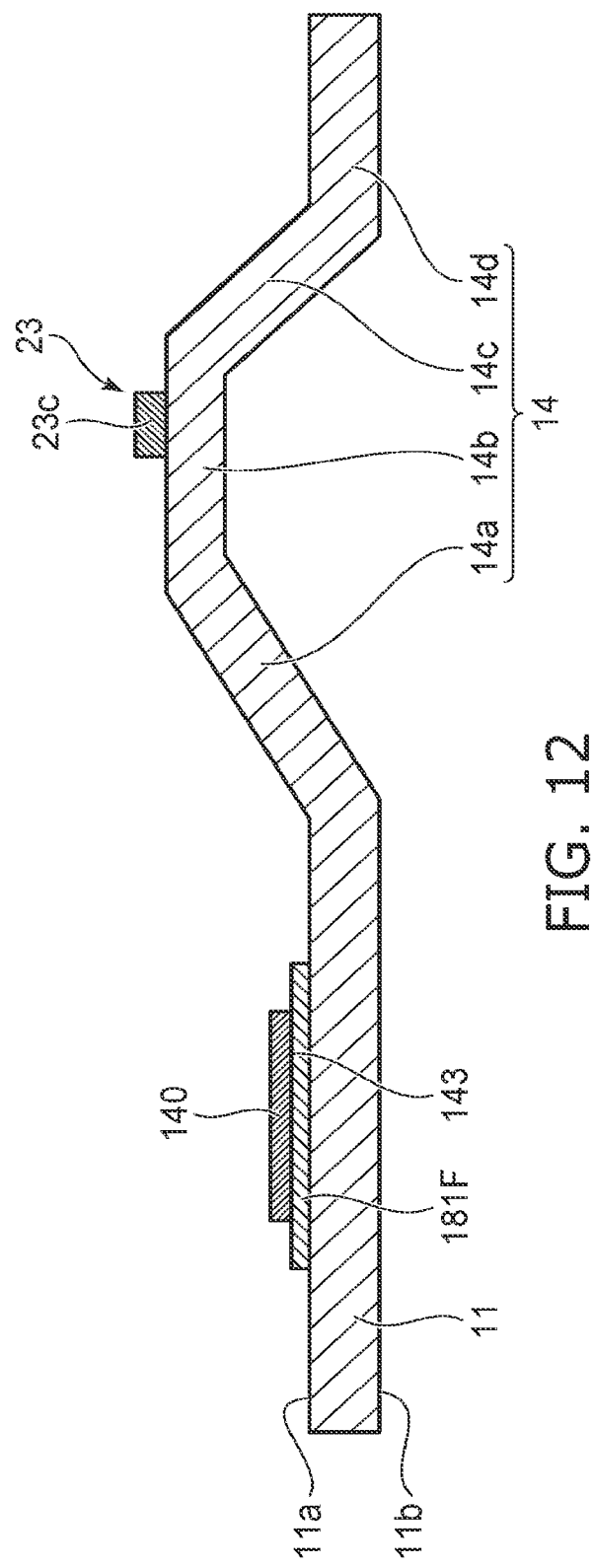
FIG. 12 is an end view along line B-B of FIG. 11.

FIG. 12 is an end view along line B-B' of FIG. 11.

Then, as shown in FIG. 10, one connector member 20 is disposed on the solder 182F to 185F.

The connector member 20 is made of a conductive material such as copper, etc. The connector member 20 includes a first conductive part 21, a second conductive part 22, and a connection part 23. The first conductive part 21 of the connector member 20 is disposed on the solder 182F and the solder 183F, and the second conductive part 22 of the connector member 20 is disposed on the solder 184F and the solder 185F.

The first conductive part 21 includes a first part 21a, a second part 21b, and a third part 21c. The first part 21a is disposed on the solder 182F. The second part 21b is disposed on the solder 183F. The second part 21b is plate-shaped. As shown in FIGS. 10 and 11, the second part 21b is more proximate to the first part 11 than a step 12e of the leadframe 10 in the X-direction. The third part 21c connects the first part 21a and the second part 21b and extends along a direction oblique to the X-direction and the Z-direction.

The second conductive part 22 includes a first part 22a, a second part 22b, and a third part 22c. The first part 22a is disposed on the solder 184F. The second part 22b is disposed on the solder 185F. The second part 22b is plate-shaped. As shown in FIGS. 10 and 11, the second part 22b is more proximate to the first part 11 than a step 13e of the leadframe 10 in the X-direction. The third part 22c connects the first part 22a and the second part 22b and extends along a direction oblique to the X-direction and the Z-direction.

The connection part 23 connects the first conductive part and the second conductive part 22. Specifically, the connection part 23 includes a first extension part 23a, a second extension part 23b, and a third extension part 23c. The first extension part 23a is connected to the second part 21b of the first conductive part 21 and extends along the X-direction from the second part 21b. The second extension part 23b is connected to the second part 22b of the second conductive part 22 and extends along the X-direction from the second part 22b. The third extension part 23c is connected to the first extension part 23a and the second extension part 23b and extends along the Y-direction.

As shown in FIG. 12, the third extension part 23c of the connection part 23 and the second extension part 14b of the fourth part 14 of the leadframe 10 contact each other in the Z-direction.

Then, an intermediate body 30 that includes the leadframe 10, the semiconductor chip 140, the solder 181F to 185F, and the connector member 20 is placed inside a reflow furnace; the solder 181F to 185F is heated; and the solder 181F to 185F is melted. Subsequently, the solder 181F to 185F is cooled and solidified. The first part 11 and the semiconductor chip 140 are bonded thereby. Also, the first conductive part 21 of the connector member 20 is bonded thereby to the first terminal 141 of the semiconductor chip 140 and the second part 12 of the leadframe 10. Also, the second conductive part 22 of the connector member 20 is bonded thereby to the second terminal 142 of the semiconductor chip 140 and the third part 13 of the leadframe 10.

When heating in the reflow furnace, there are cases where the solder 181F to 185F temporarily melts and flows. There are cases where air flows inside the reflow furnace when the intermediate body 30 is heated by directing hot air inside the reflow furnace. There are cases where air flows inside the reflow furnace when depressurizing the reflow furnace to approach a vacuum to suppress the occurrence of voids. In the embodiment, because the first conductive part 21 and the second conductive part 22 are connected by the connection part 23, a change of the positional relationship between the first conductive part 21 and the second conductive part 22 can be suppressed even under such conditions. Thus, in the embodiment, the first conductive part 21 and the second conductive part 22 can be prevented from approaching each other because the first conductive part 21 and the second conductive part 22 are formed from one connector member 20 to have a continuous body.

Also, when the first conductive part 21 and the second conductive part 22 are separate, there is a possibility that the air that flows inside the reflow furnace may blow off at least one of the first conductive part 21 or the second conductive part 22. Conversely, in the embodiment, the first conductive part 21 and the second conductive part 22 are formed from one connector member 20 to have a continuous body and are not easily blown off by the flow of the air inside the reflow furnace.

As shown in FIGS. 10 and 11, the connector member 20 can be prevented from separating in the X-direction from the first and second terminals 141 and 142 of the semiconductor chip 140 by the steps 12e and 13e of the leadframe 10.

As shown in FIG. 12, the connection part 23 and the fourth part 14 of the leadframe 10 contact each other in the Z-direction. Therefore, the misalignment of the connector member 20 with respect to the leadframe 10 can be suppressed by the friction force acting between the connection part 23 and the fourth part 14.

Figure 13:
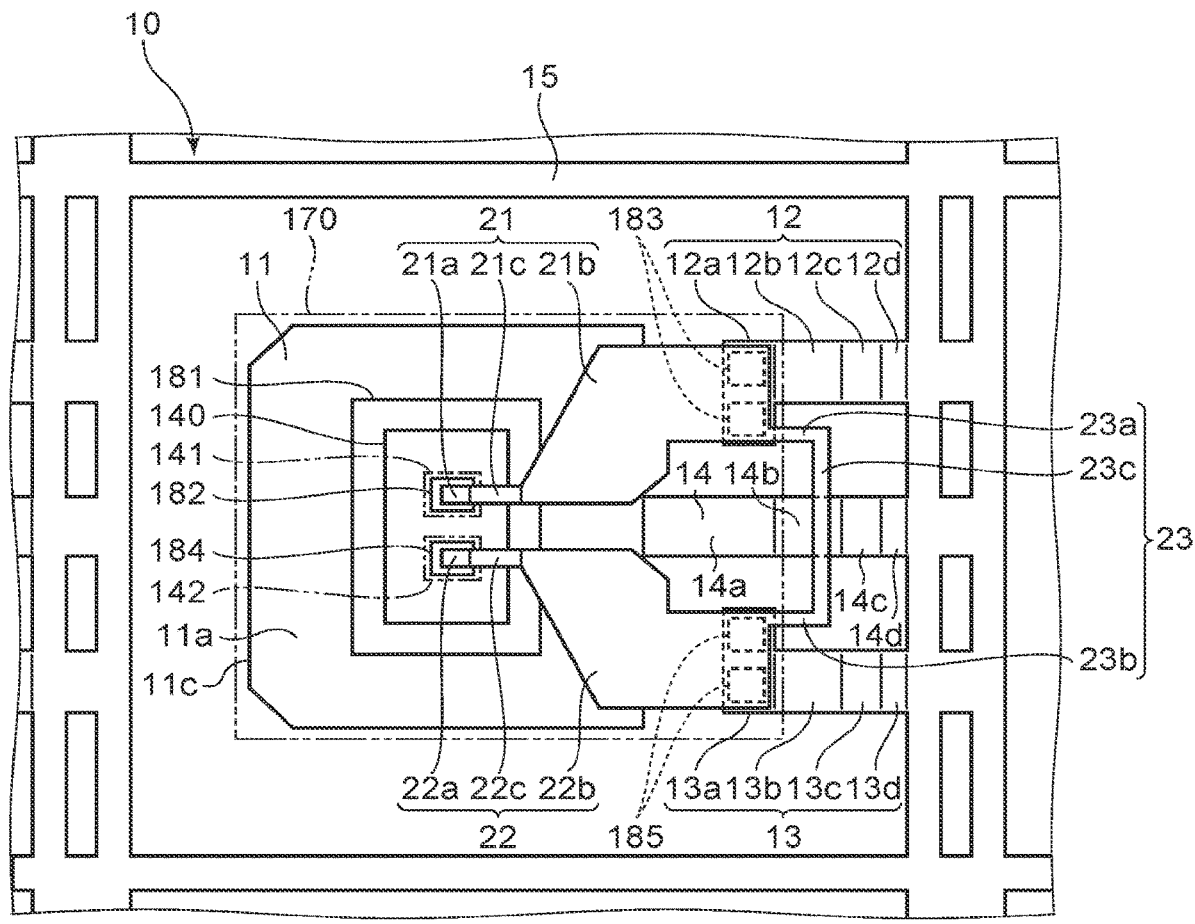
FIG. 13 is a top view showing the method for manufacturing the semiconductor device according to the first embodiment.
Figure 14:
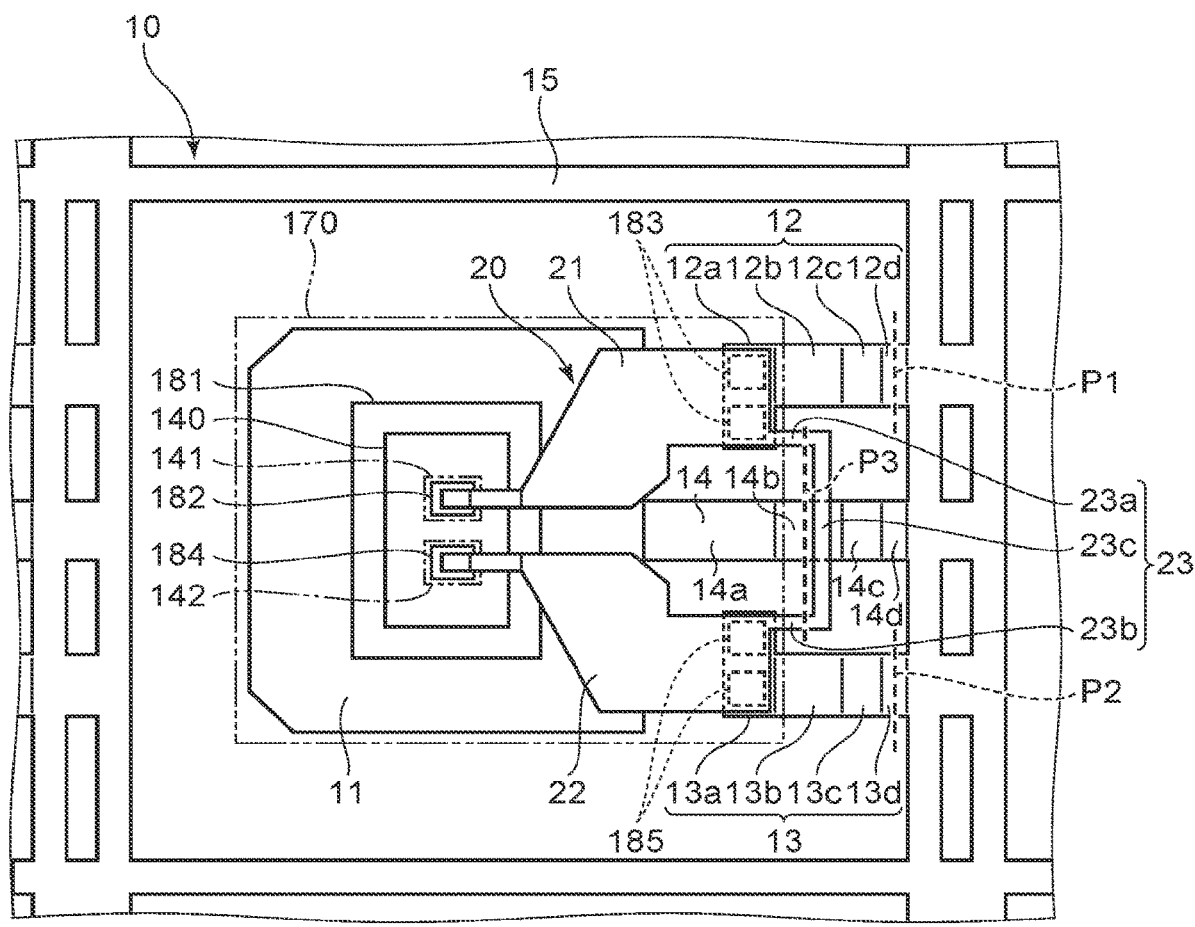
FIG. 14 is a top view showing the method for manufacturing the semiconductor device according to the first embodiment.
Figure 15:
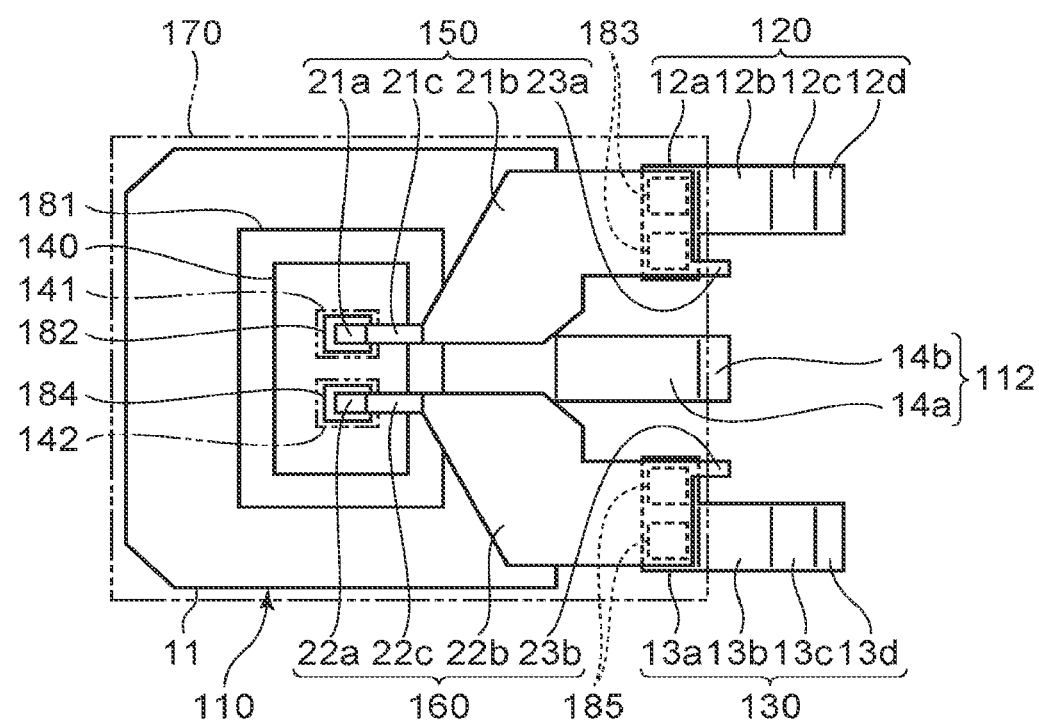
FIG. 15 is a top view showing the method for manufacturing the semiconductor device according to the first embodiment.

FIGS. 13 to 15 are top views showing the method for manufacturing the semiconductor device according to the embodiment.

In FIGS. 13 to 15, the solder 181F after reflow is illustrated by reference numeral 181, the solder 182F after reflow is illustrated by reference numeral 182, the solder 183F after reflow is illustrated by reference numeral 183, the solder 184F after reflow is illustrated by reference numeral 184, and the solder 185F after reflow is illustrated by reference numeral 185.

Then, as shown in FIG. 13, the sealing member 170 is formed. The sealing member 170 is formed to cover the semiconductor chip 140, the bonding part of the connector member 20 with the first terminal 141, the bonding part of the connector member 20 with the second terminal 142, the bonding part of the connector member 20 with the second part 12, and the bonding part of the connector member 20 with the third part 13.

Specifically, the sealing member 170 is formed to cover the upper surface 11a and the side surface 11c of the first part 11 of the leadframe 10. Also, the sealing member 170 covers the flat plate part 12a of the second part 12 and one portion of the first extension part 12b of the leadframe 10. Also, the sealing member 170 covers the flat plate part 13a of the third part 13 and one portion of the first extension part 13b of the leadframe 10. Also, the sealing member 170 covers the first extension part 14a of the fourth part 14 and one portion of the second extension part 14b of the leadframe 10. Also, the sealing member 170 covers the first conductive part 21, the second conductive part 22, one portion of the first extension part 23a, the connection part 23, and one portion of the second extension part 23b of the connection part 23 of the connector member 20. Also, the sealing member 170 covers the bonding members 181 to 185.

The sealing member 170 leaves a portion of the connector member 20 and a portion of the leadframe 10 exposed. Specifically, the sealing member 170 leaves the lower surface 11b of the first part 11 of the leadframe 10 exposed. Also, the sealing member 170 leaves the third extension part 12d, the second extension part 12c, and another portion of the first extension part 12b of the second part 12 of the leadframe 10 exposed. Also, the sealing member 170 leaves the third extension part 13d, the second extension part 13c, and another portion of the first extension part 13b of the third part 13 of the leadframe 10 exposed. Also, the sealing member 170 leaves the fourth extension part 14d, the third extension part 14c, and another portion of the second extension part 14b of the fourth part 14 of the leadframe 10 exposed. Also, the sealing member 170 leaves the third extension part 23c, another portion of the second extension part 23b, and another portion of the first extension part 23a of the connection part 23 of the connector member 20 exposed.

Then, as shown in FIGS. 14 and 15, at least a portion of the second part 12 and at least a portion of the third part 13 of the leadframe 10 are separated from the frame 15. Specifically, the third extension part 12d of the second part 12 is cut along broken line P1, and the third extension part 13d of the third part 13 is cut along broken line P2 in FIG. 14.

As a result, as shown in FIG. 15, the second leadframe 120 is formed of the flat plate part 12a, the first extension part 12b, the second extension part 12c, and a portion of the third extension part 12d of the second part 12. The third leadframe 130 is formed of the flat plate part 13a, the first extension part 13b, the second extension part 13c, and a portion of the third extension part 13d of the third part 13.

As shown in FIGS. 14 and 15, the first conductive part 21 and the second conductive part 22 are separated by removing at least a section of the portion of the connector member 20 exposed outside the sealing member 170. At least a portion of the fourth part 14 of the leadframe 10 is separated from the frame 15. Specifically, the first extension part 23a and the second extension part 23b of the connection part 23 and the second extension part 14b of the fourth part 14 are cut along broken line P3 of FIG. 14.

As a result, as shown in FIG. 15, the first conductive member 150 is formed of the first part 21a, the second part 21b, and the third part 21c of the first conductive part 21 and a portion of the first extension part 23a of the connection part 23. The second conductive member 160 is formed of the first part 22a, the second part 22b, and the third part 22c of the second conductive part 22 and a portion of the second extension part 23b of the connection part 23. The main part 111 of the first leadframe 110 is formed of the first part 11. The protruding part 112 of the first leadframe 110 is formed of the first extension part 14a and a portion of the second extension part 14b of the fourth part 14.

The process of removing the at least a section of the portion of the connector member 20 exposed outside the sealing member 170 may be performed before or simultaneously with the process of separating the second and third parts 12 and 13 of the leadframe 10 from the frame 15. The process of removing the at least a section of the portion of the connector member 20 exposed outside the sealing member 170 may be performed simultaneously with or separately from the process of separating the fourth part 14 from the frame 15.

In the example described in the embodiment, the fourth part 14 is connected to the first part 11 and the frame 15. However, the fourth part 14 may not be connected to the first part 11 and may be connected only to the frame 15; and the first part 11 may be connected to the frame 15 separately. In such a case, the connection part between the first part 11 and the frame 15 may be exposed when forming the sealing member 170, and at least a portion of the first part 11 may be separated from the frame 15 after the process of forming the sealing member 170.

Effects of the embodiment will now be described.

In the method for manufacturing the semiconductor device 100 according to the embodiment, first, the semiconductor chip 140 is fixed to the first part 11 of the leadframe 10. Then, one connector member 20 is bonded to the first and second terminals 141 and 142 of the semiconductor chip 140 and the second and third parts 12 and 13 of the leadframe 10. Then, the sealing member 170 is formed to cover the semiconductor chip 140, the bonding part of the connector member 20 with the first terminal 141, the bonding part of the connector member 20 with the second terminal 142, the bonding part of the connector member 20 with the second part 12, and the bonding part of the connector member 20 with the third part 13, and to leave a portion of the connector member 20 and a portion of the leadframe 10 exposed. Then, the first conductive part 21 of the connector member 20 that is bonded to the first terminal 141 and the second part 12 and the second conductive part 22 of the connector member 20 that is bonded to the second terminal 142 and the third part 13 are separated by removing at least a section of the portion of the connector member 20 exposed outside the sealing member 170. Thus, in the embodiment, the first conductive part 21 and the second conductive part 22 are formed from one connector member 20 to have a continuous body in the process of bonding the first conductive part 21 to the first terminal 141 and the second part 12 and bonding the second conductive part 22 to the second terminal 142 and the third part 13. Therefore, the first conductive part 21 and the second conductive part 22 can be prevented from approaching each other. As a result, the first and second terminals 141 and 142 of the semiconductor chip 140 can be prevented from being electrically connected and short-circuiting.

In the semiconductor device 100 manufactured by such a manufacturing method, the sealing member 170 covers the semiconductor chip 140, the bonding part between the first terminal 141 and the first conductive member 150, the bonding part between the second terminal 142 and the second conductive member 160, the bonding part between the second leadframe 120 and the first conductive member 150, and the bonding part between the third leadframe 130 and the second conductive member 160 and leaves exposed a portion of the first leadframe 110, a portion of the second leadframe 120, a portion of the third leadframe 130, the end surface of the first conductive member 150, and the end surface of the second conductive member 160.

The process of bonding the connector member 20 includes the process of disposing the solder 182F to 185F respectively between the first terminal 141 and the connector member 20, between the second part 12 and the connector member 20, between the second terminal 142 and the connector member 20, and between the third part 13 and the connector member 20 and includes the process of heating the solder 182F to 185F inside a reflow furnace. At this time, there are cases where the solder 182F to 185F temporarily melts and flows. In the embodiment, the first conductive part 21 and the second conductive part 22 can be prevented from approaching each other even under such conditions because the first conductive part 21 and the second conductive part 22 are formed from one connector member 20 to have a continuous body.

In the process of bonding the connector member 20, the connector member 20 contacts, in one direction (the Z-direction), the fourth part 14 that is positioned between the second part 12 and the third part 13 of the leadframe 10. Therefore, the misalignment of the connector member 20 with respect to the leadframe 10 can be suppressed by the friction force acting between the connector member 20 and the fourth part 14.

Second Embodiment

A second embodiment will now be described.

Figure 16:
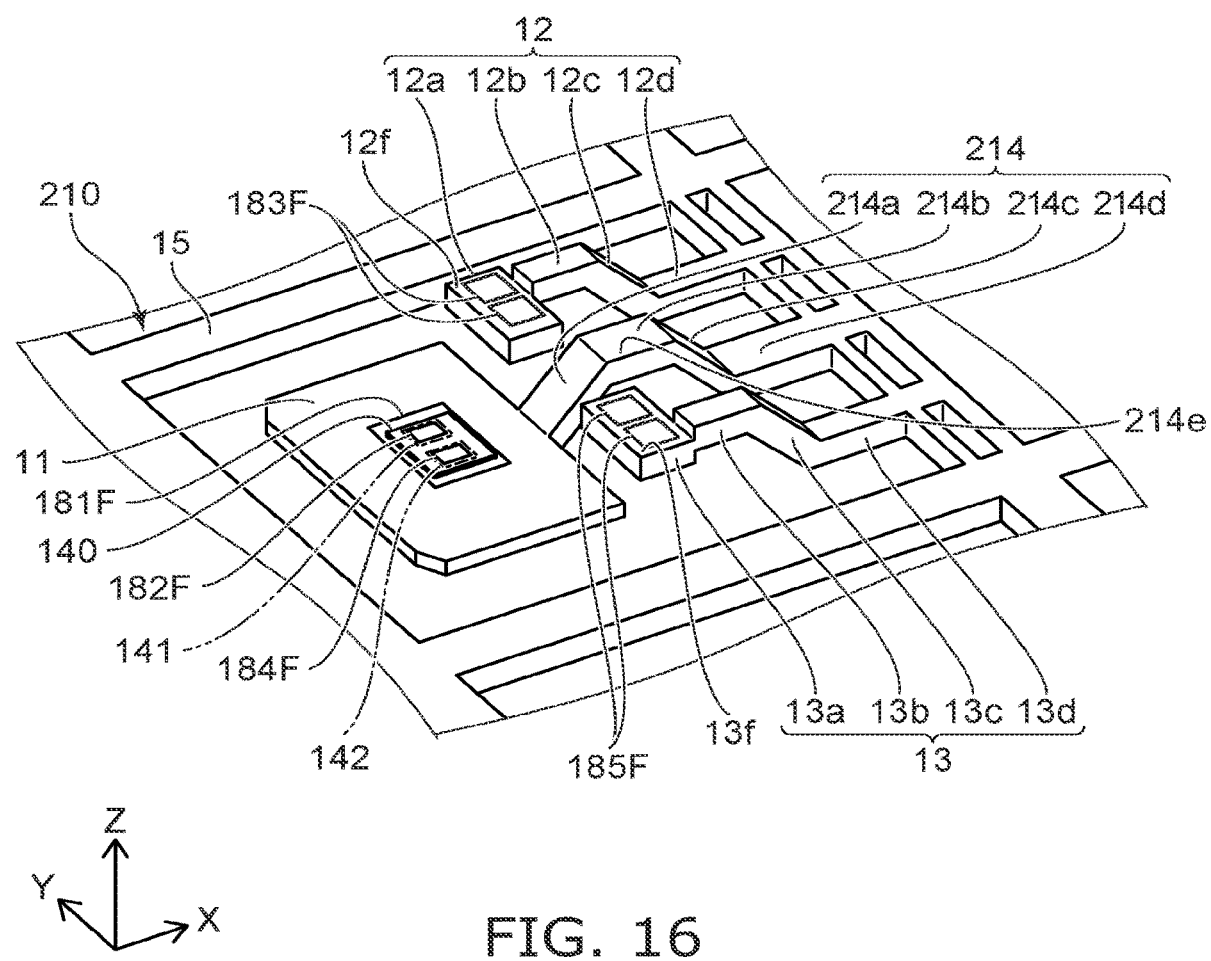
FIG. 16 is a perspective view showing one leadframe and the periphery of the leadframe of a method for manufacturing a semiconductor device according to a second embodiment.

FIG. 16 is a perspective view showing one leadframe and the periphery of the leadframe of a method for manufacturing a semiconductor device according to the embodiment.

Figure 17:
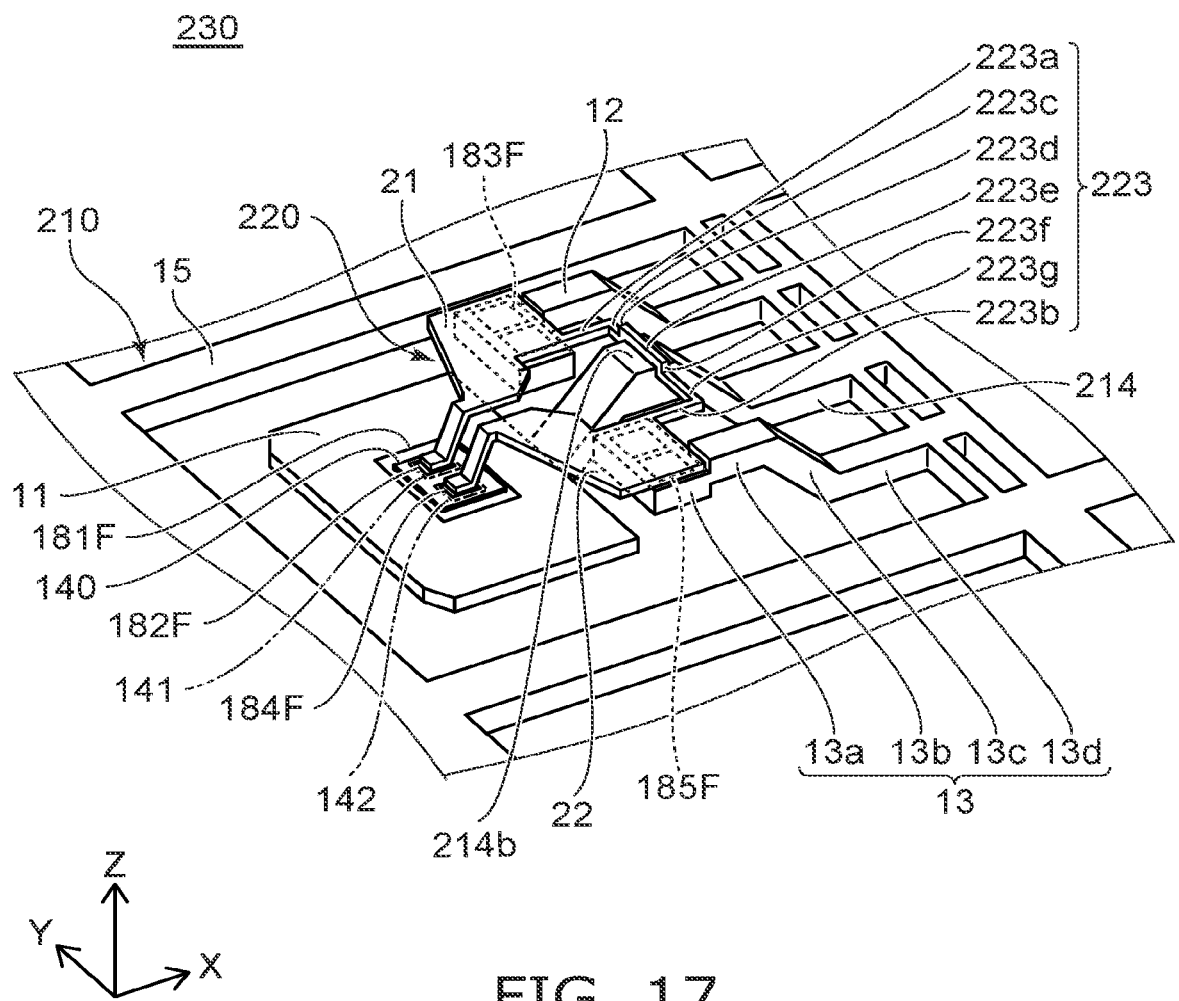
FIG. 17 is a perspective view showing an intermediate body of the method for manufacturing the semiconductor device according to the second embodiment.

FIG. 17 is a perspective view showing an intermediate body of the method for manufacturing the semiconductor device according to the embodiment.

Figure 18:
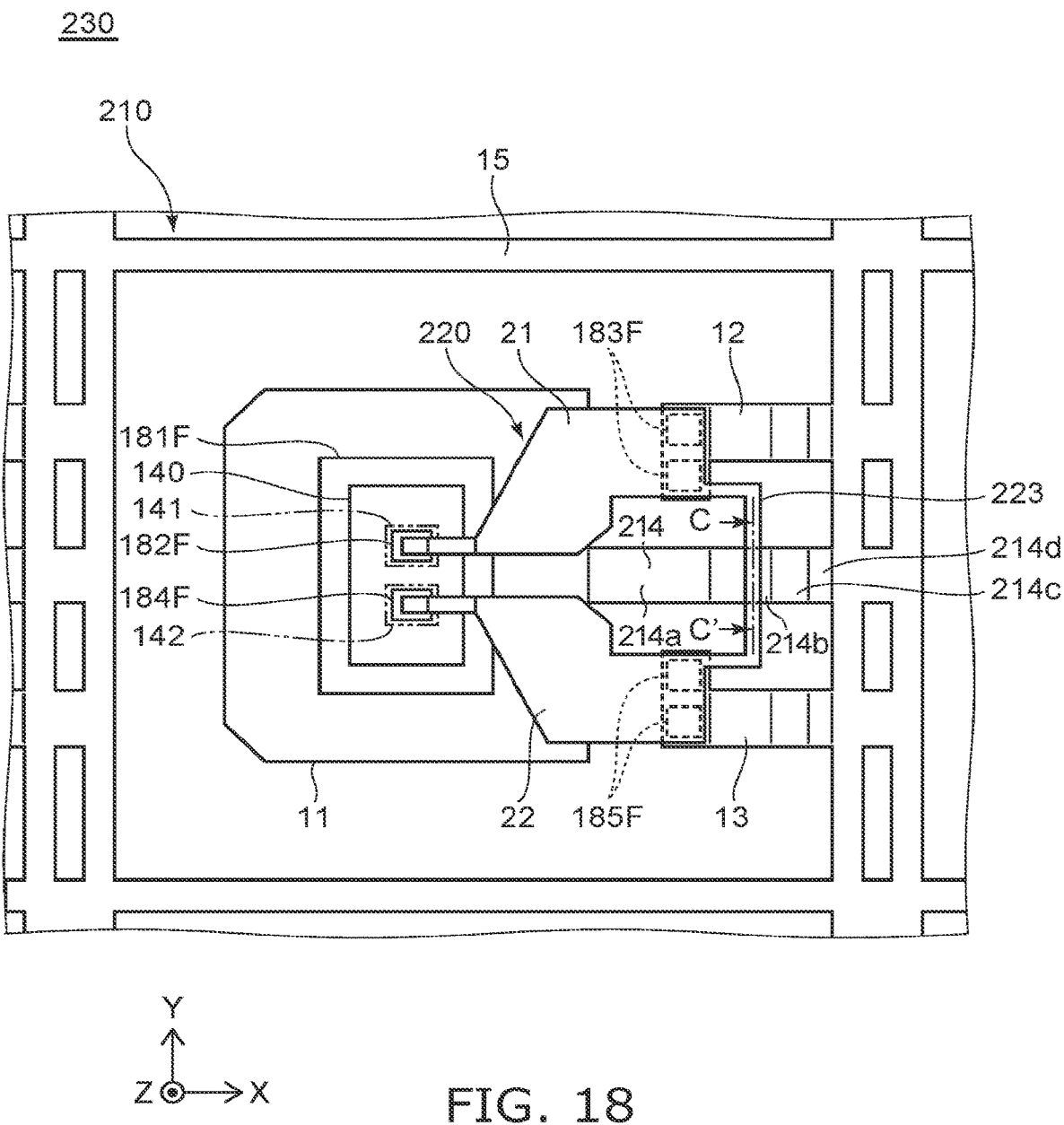
FIG. 18 is a top view showing the intermediate body.

FIG. 18 is a top view showing the intermediate body.

Figure 19:
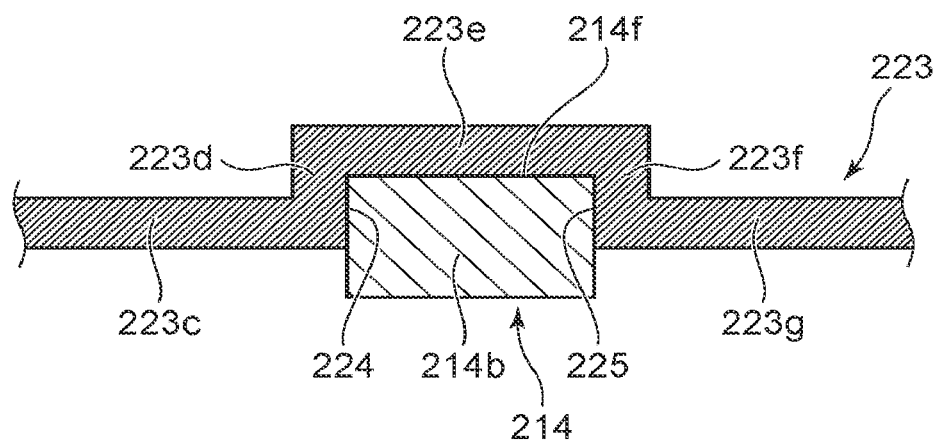
FIG. 19 is an end view along line C-C of FIG. 18.

FIG. 19 is an end view along line C-C' of FIG. 18.

The shape of a fourth part 214 of a leadframe 210 and the shape of a connection part 223 of a connector member 220 of the method for manufacturing the semiconductor device 200 according to the embodiment are different from those of the method for manufacturing the semiconductor device 100 according to the first embodiment. Only the differences with the first embodiment are described below. The embodiment is similar to the first embodiment other than the following items.

First, the leadframe 210 is prepared. The fourth part 214 of the leadframe 210 includes a first extension part 214a, a second extension part 214b, a third extension part 214c, and a fourth extension part 214d.

The first extension part 214a is connected to the first part 11. The first extension part 214a extends along a direction oblique to the Z-direction and the X-direction so that the first extension part 214a extends along the upward direction as the first extension part 214a extends along the X-direction.

The second extension part 214b is connected to the first extension part 214a and extends along the X-direction from the first extension part 214a. An upper surface 214e of the second extension part 214b is parallel to the X-direction and the Y-direction. The upper surface 214e is positioned higher than the upper surface 12f of the flat plate part 12a of the second part 12 and the upper surface 13f of the flat plate part 13a of the third part 13.

The third extension part 214c is connected to the second extension part 214b. The third extension part 214c extends along the downward direction as it extends along the X-direction and extends along a direction oblique to the X-direction and the Z-direction.

The fourth extension part 214d is connected to the third extension part 214c and the frame 15 and extends along the X-direction.

Then, the solder 181F before reflow is disposed on the first part 11 of the leadframe 210.

Continuing, the semiconductor chip 140 is disposed on the solder 181F. The semiconductor chip 140 is fixed thereby to the first part 11.

Then, the solder 182F before reflow is disposed on the first terminal 141 of the semiconductor chip 140. The solder 184F before reflow is disposed on the second terminal 142 of the semiconductor chip 140. The solder 183F before reflow is disposed on the flat plate part 12a of the second part 12 of the leadframe 10. The solder 185F before reflow is disposed on the flat plate part 13a of the third part 13 of the leadframe 10.

Then, as shown in FIG. 17, one connector member 220 is disposed on the solder 182F to 185F.

The connector member 220 is made of a conductive material such as copper, etc. As shown in FIGS. 17 and 19, the connection part 223 of the connector member 220 includes a first extension part 223a, a second extension part 223b, a third extension part 223c, a fourth extension part 223d, a fifth extension part 223e, a sixth extension part 223f, and a seventh extension part 223g.

The first extension part 223a is connected to the first conductive part 21 and extends along the X-direction. The second extension part 223b is connected to the second conductive part 22 and extends along the X-direction.

The third extension part 223c is connected to the first extension part 223a and extends along the Y-direction from the first extension part 223a toward the second extension part 223b. As shown in FIG. 19, the fourth extension part 223d is connected to the third extension part 223c and extends in the upward direction from the third extension part 223c. The fifth extension part 223e is connected to the fourth extension part 223d and extends along the Y-direction. The sixth extension part 223f is connected to the fifth extension part 223e and extends toward the downward direction from the fifth extension part 223e. As shown in FIGS. 17 and 19, the seventh extension part 223g is connected to the sixth extension part 223f and the second extension part 223b.

A step 224 is formed of the lower surface of the fifth extension part 223e and the surface of the fourth extension part 223d facing the sixth extension part 223f. Also, a step 225 is formed of the lower surface of the fifth extension part 223e and the surface of the sixth extension part 223f facing the fourth extension part 223d. Thus, the pair of steps 224 and 225 is provided in the lower surface of the connection part 223.

As shown in FIGS. 17 and 19, when the connector member 220 is disposed on the solder 182F to 185F before reflow, the second extension part 214b of the fourth part 214 of the leadframe 210 is located between the pair of steps 224 and 225. Thereby, the connector member 220 and the fourth part 214 of the leadframe 210 engage each other. "Engage" means that when the connector member is biased to relatively misalign with the leadframe, the relative misalignment between the connector member and the leadframe is restricted in at least two directions by contact between the connector member and the fourth part 214 of the leadframe. In the embodiment, the relative misalignment between the connector member 220 and the leadframe 210 is restricted in the three directions of the downward direction, the direction from the first conductive part 21 toward the second conductive part 22 (the reverse direction of the Y-direction), and the direction from the second conductive part 22 toward the first conductive part 21 (the Y-direction).

Then, an intermediate body 230 that includes the leadframe 210, the semiconductor chip 140, the solder 181F to 185F, and the connector member 220 is placed inside a reflow furnace; the solder 181F to 185F is heated; and the solder 181F to 185F is melted. Subsequently, the solder 181F to 185F is cooled and solidified. In the embodiment, the connector member 220 and the fourth part 214 of the leadframe 210 engage each other. Therefore, the misalignment of the connector member 220 with respect to the leadframe 210 can be suppressed.

Thereafter, the procedure is similar to the method for manufacturing the semiconductor device 100 of the first embodiment, and a description is therefore omitted.

Figure 20:
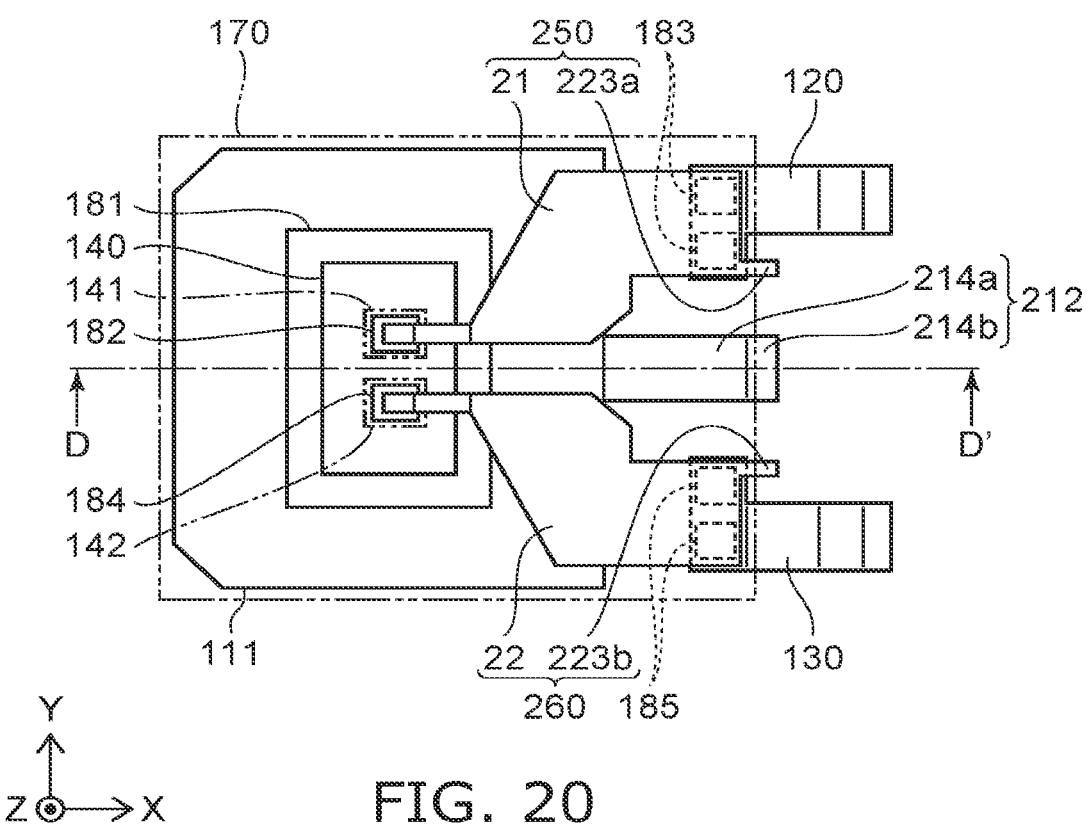
FIG. 20 is a top view showing the semiconductor device according to the second embodiment.

FIG. 20 is a top view showing the semiconductor device according to the embodiment.

Figure 21:
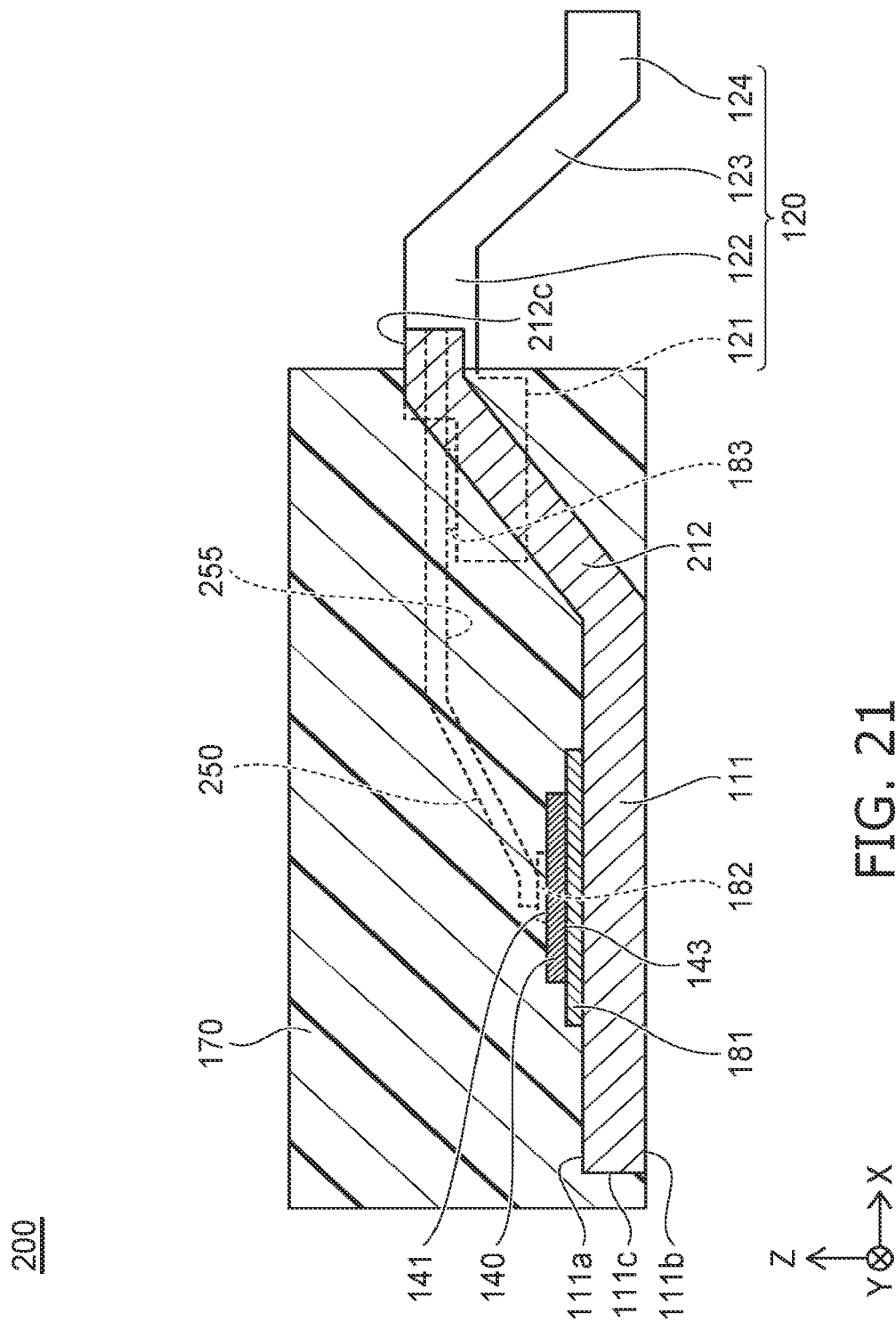
FIG. 21 is an end view along line D-D of FIG. 20.

FIG. 21 is an end view along line D-D' of FIG. 20.

As shown in FIG. 20, in the semiconductor device 200 thus manufactured, a first conductive member 250 is formed of the first conductive part 21 and at least a portion of the first extension part 223a of the connection part 223. A second conductive member 260 is formed of the second conductive part 22 and at least a portion of the second extension part 223b of the connection part 223. A protruding part 212 is formed of the first extension part 214a and a portion of the second extension part 214b of the fourth part 214. As shown in FIG. 21, a lower surface 255 of the first conductive member 250 that is connected to the bonding member 183 is positioned lower than an upper surface 212c of the portion of the protruding part 212 exposed outside the sealing member 170.

Effects of the embodiment will now be described.

In the embodiment, the connector member 220 and the fourth part 214 engage each other in the process of bonding the connector member 220. Therefore, the misalignment of the connector member 220 with respect to the leadframe 10 can be suppressed.

Because the fourth part 214 is disposed between the pair of steps 224 and 225 provided in the connector member 220, the fourth part 214 engages the connector member 220 in the process of bonding the connector member 220. Therefore, the misalignment of the connector member 220 with respect to the leadframe 10 can be suppressed in at least three directions.

Third Embodiment

A third embodiment will now be described.

Figure 22:
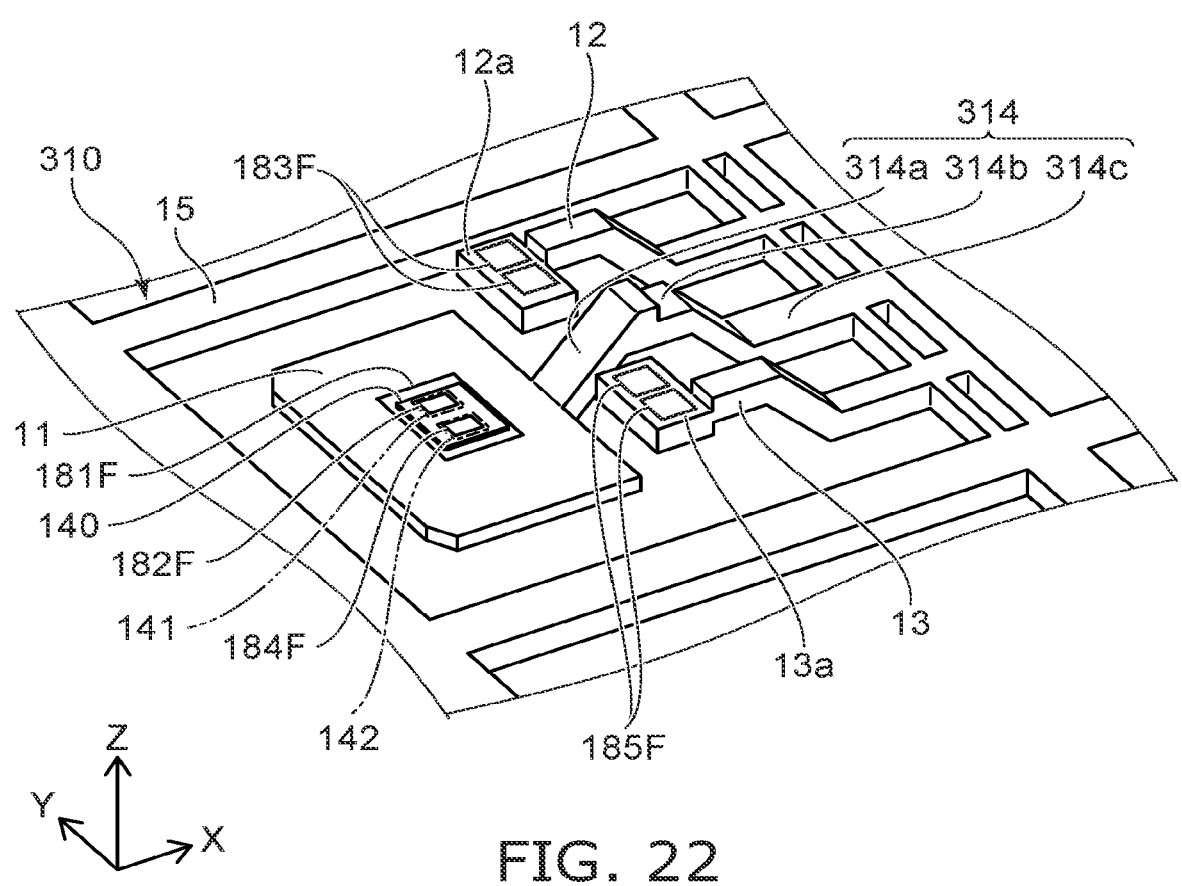
FIG. 22 is a perspective view showing one leadframe and the periphery of the leadframe of a method for manufacturing a semiconductor device according to a third embodiment.

FIG. 22 is a perspective view showing one leadframe and the periphery of the leadframe of a method for manufacturing a semiconductor device according to the embodiment.

Figure 23:
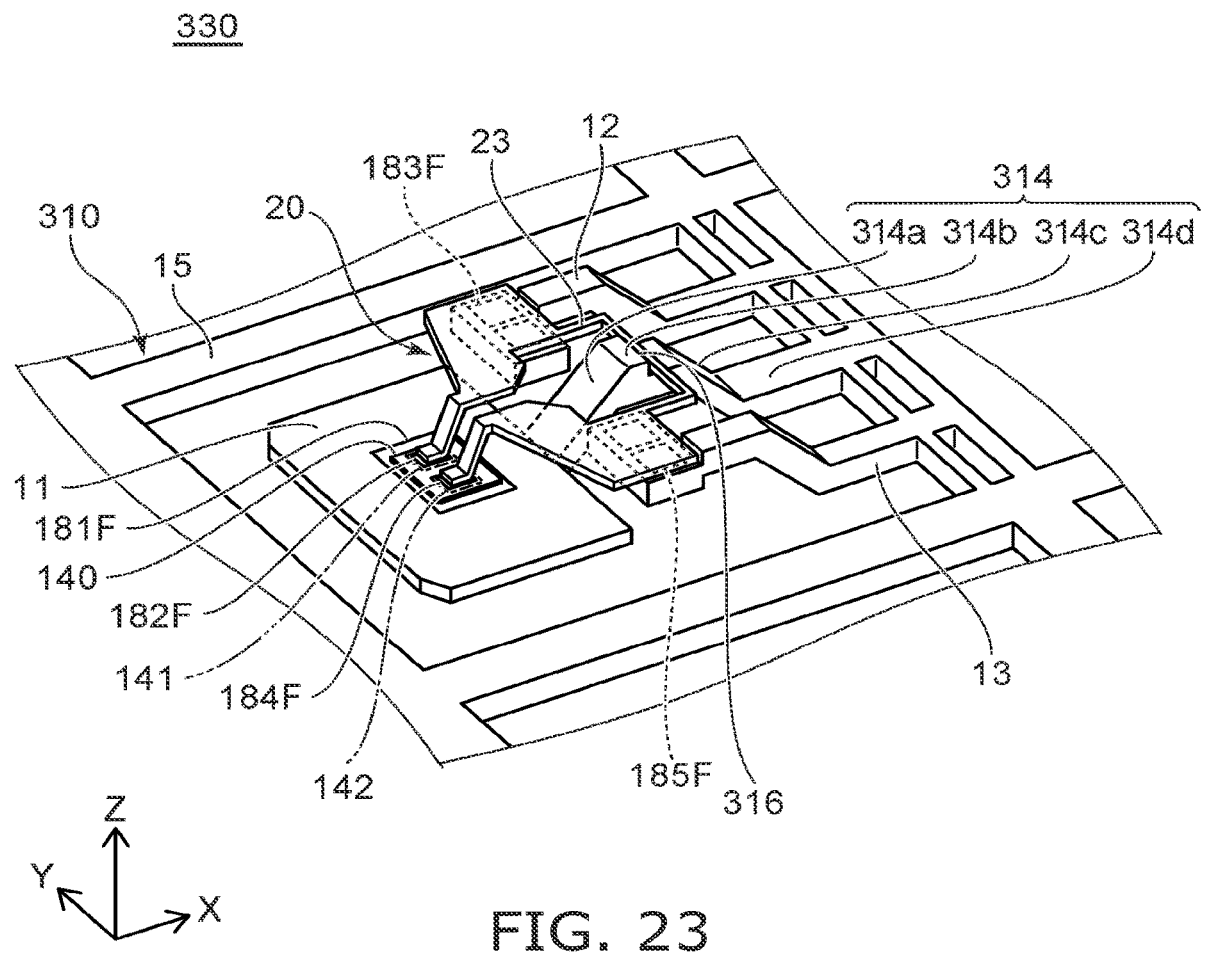
FIG. 23 is a perspective view showing an intermediate body of the method for manufacturing the semiconductor device according to the third embodiment.

FIG. 23 is a perspective view showing an intermediate body of the method for manufacturing the semiconductor device according to the embodiment.

Figure 24:
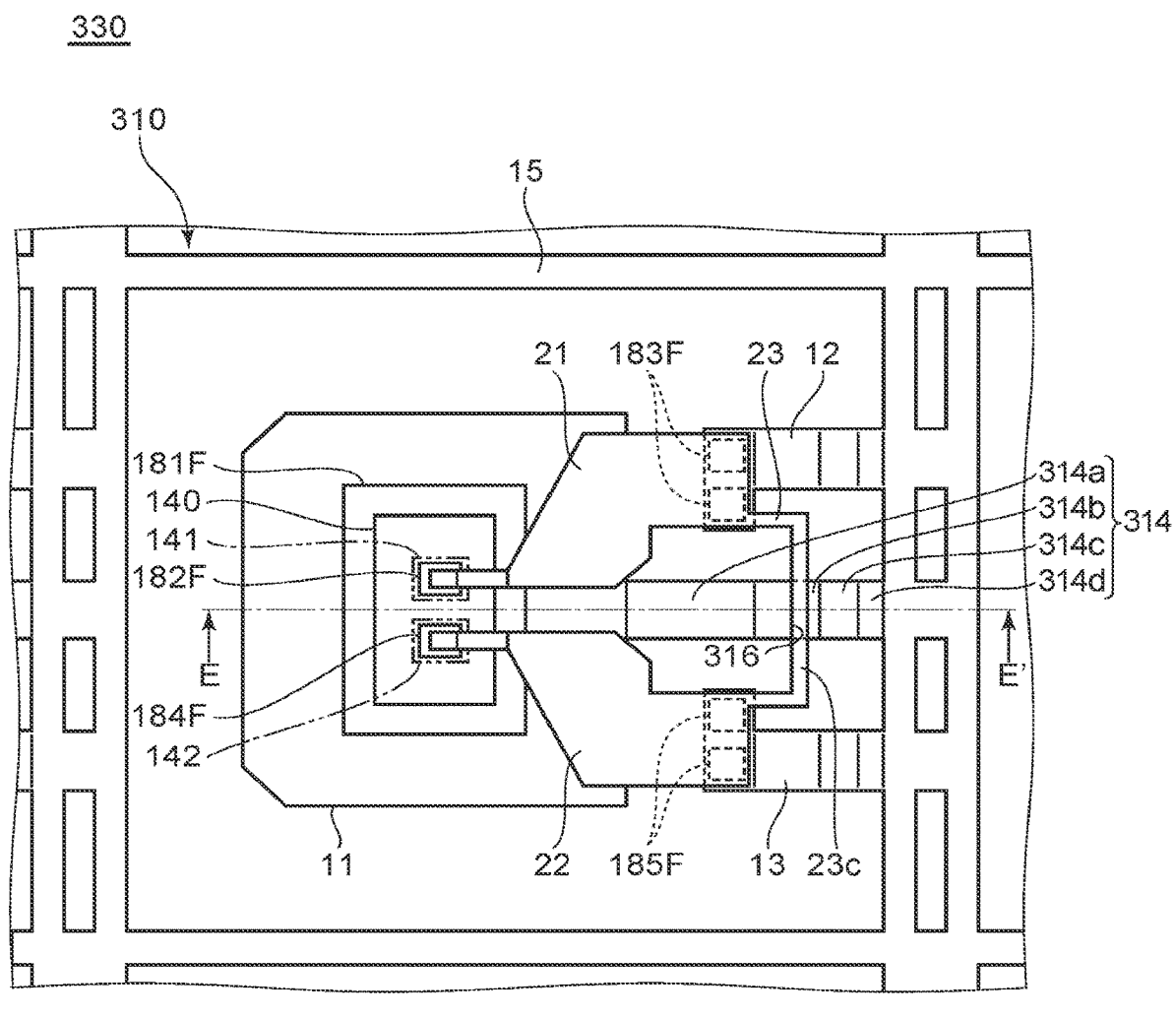
FIG. 24 is a top view showing the intermediate body.

FIG. 24 is a top view showing the intermediate body.

Figure 25:
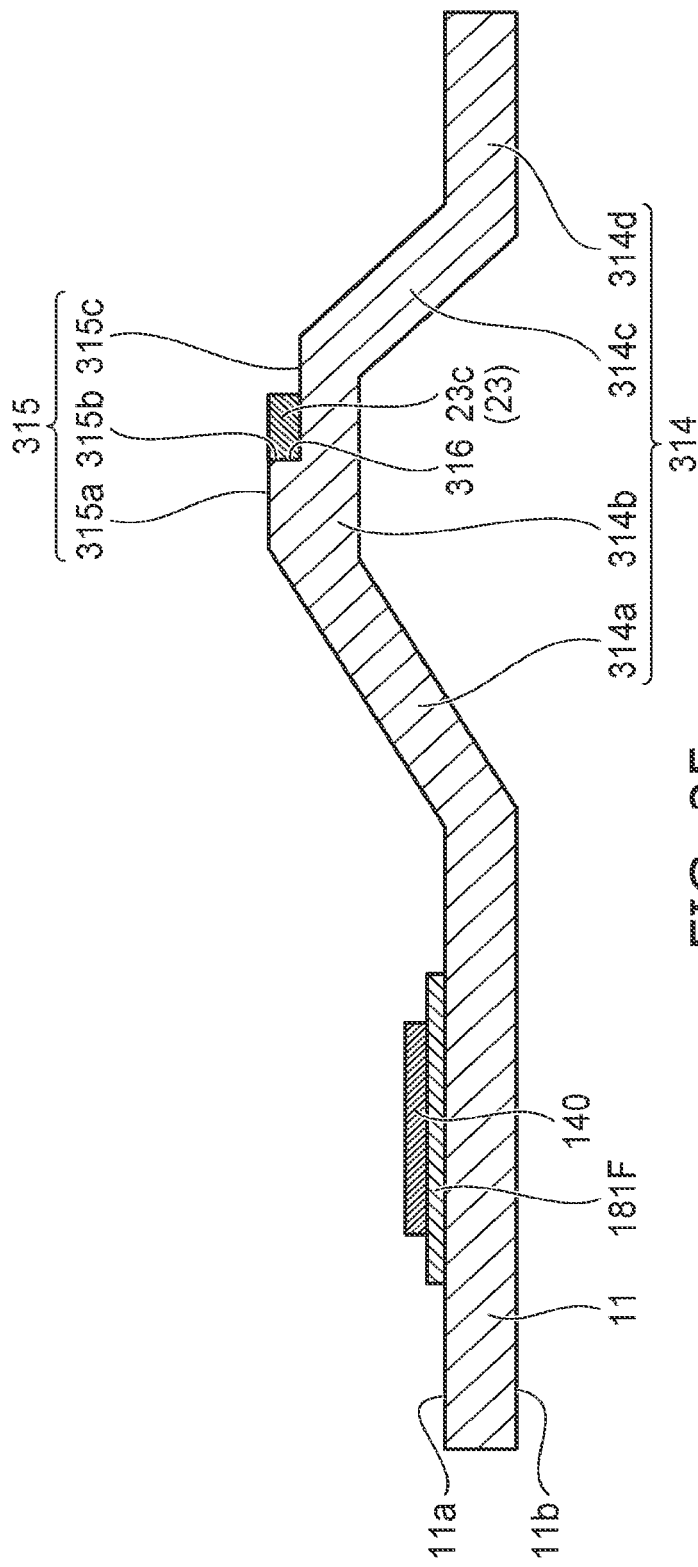
FIG. 25 is an end view along line E-E of FIG. 24.

FIG. 25 is an end view along line E-E' of FIG. 24.

The shape of a fourth part 314 of a leadframe 310 of the method for manufacturing the semiconductor device 300 according to the embodiment is different from that of the method for manufacturing the semiconductor device 100 according to the first embodiment.

First, the leadframe 310 is prepared. The fourth part 314 of the leadframe 310 includes a first extension part 314a, a second extension part 314b, a third extension part 314c, and a fourth extension part 314d.

The first extension part 314a is connected to the first part 11. The first extension part 314a extends along a direction oblique to the Z-direction and the X-direction so that the first extension part 314a extends along the upward direction as the first extension part 314a extends along the X-direction.

The second extension part 314b is connected to the first extension part 314a and extends along the X-direction from the first extension part 314a. As shown in FIG. 25, an upper surface 315 of the second extension part 314b includes a first region 315a that is parallel to the X-direction and the Y-direction and contacts the upper surface of the first extension part 314a, a second region 315b that is parallel to the Z-direction and contacts the first region 315a, and a third region 315c that is parallel to the X-direction and the Y-direction and contacts the second region 315b. Therefore, a step 316 is formed of the second and third regions 315b and 315c.

The third extension part 314c is connected to the second extension part 314b. The third extension part 314c extends along the downward direction as it extends along the X-direction and extends along a direction oblique to the X-direction and the Z-direction.

The fourth extension part 314d is connected to the third extension part 314c and the frame 15 and extends along the X-direction.

Then, as shown in FIG. 22, the solder 181F before reflow is disposed on the first part 11 of the leadframe 210.

Continuing, the semiconductor chip 140 is disposed on the solder 181F. The semiconductor chip 140 is fixed thereby to the first part 11.

Then, the solder 182F before reflow is disposed on the first terminal 141 of the semiconductor chip 140. The solder 184F before reflow is disposed on the second terminal 142 of the semiconductor chip 140. The solder 183F before reflow is disposed on the flat plate part 12a of the second part 12 of the leadframe 10. The solder 185F before reflow is disposed on the flat plate part 13a of the third part 13 of the leadframe 10.

Then, as shown in FIG. 23, one connector member 20 is disposed on the solder 182F to 185F.

As shown in FIGS. 23 and 25, the third extension part 23c of the connection part 23 of the connector member 20 is disposed at the step 316 when the connector member 20 is disposed on the solder 182F to 185F before reflow. Thereby, the connector member 20 and the fourth part 314 of the leadframe 310 engage each other. In the embodiment, the step 316 restricts the relative misalignment between the connector member 220 and the leadframe 210 in two directions of the downward direction and the direction of approaching the first part 11 of the leadframe 310 (the reverse direction of the X-direction).

Then, the intermediate body 330 that includes the leadframe 310, the semiconductor chip 140, the solder 181F to 185F, and the connector member 20 is placed inside a reflow furnace; the solder 181F to 185F is heated; and the solder 181F to 185F is melted. Subsequently, the solder 181F to 185F is cooled and solidified. In the embodiment, the connector member 20 and the fourth part 314 of the leadframe 310 engage each other. Therefore, the misalignment of the connector member 20 with respect to the leadframe 310 can be suppressed.

Thereafter, the procedure is similar to the method for manufacturing the semiconductor device 100 of the first embodiment, and a description is therefore omitted.

Figure 26:
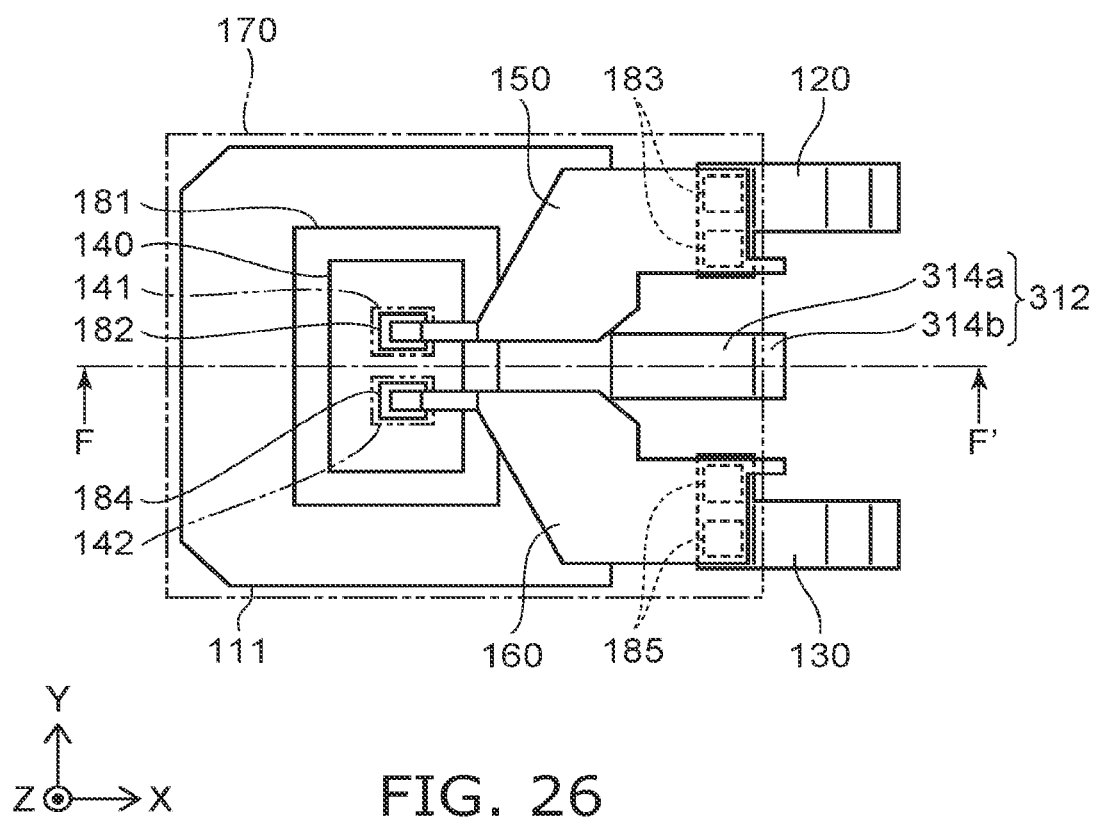
FIG. 26 is a top view showing the semiconductor device according to the third embodiment.

FIG. 26 is a top view showing the semiconductor device according to the embodiment.

Figure 27:
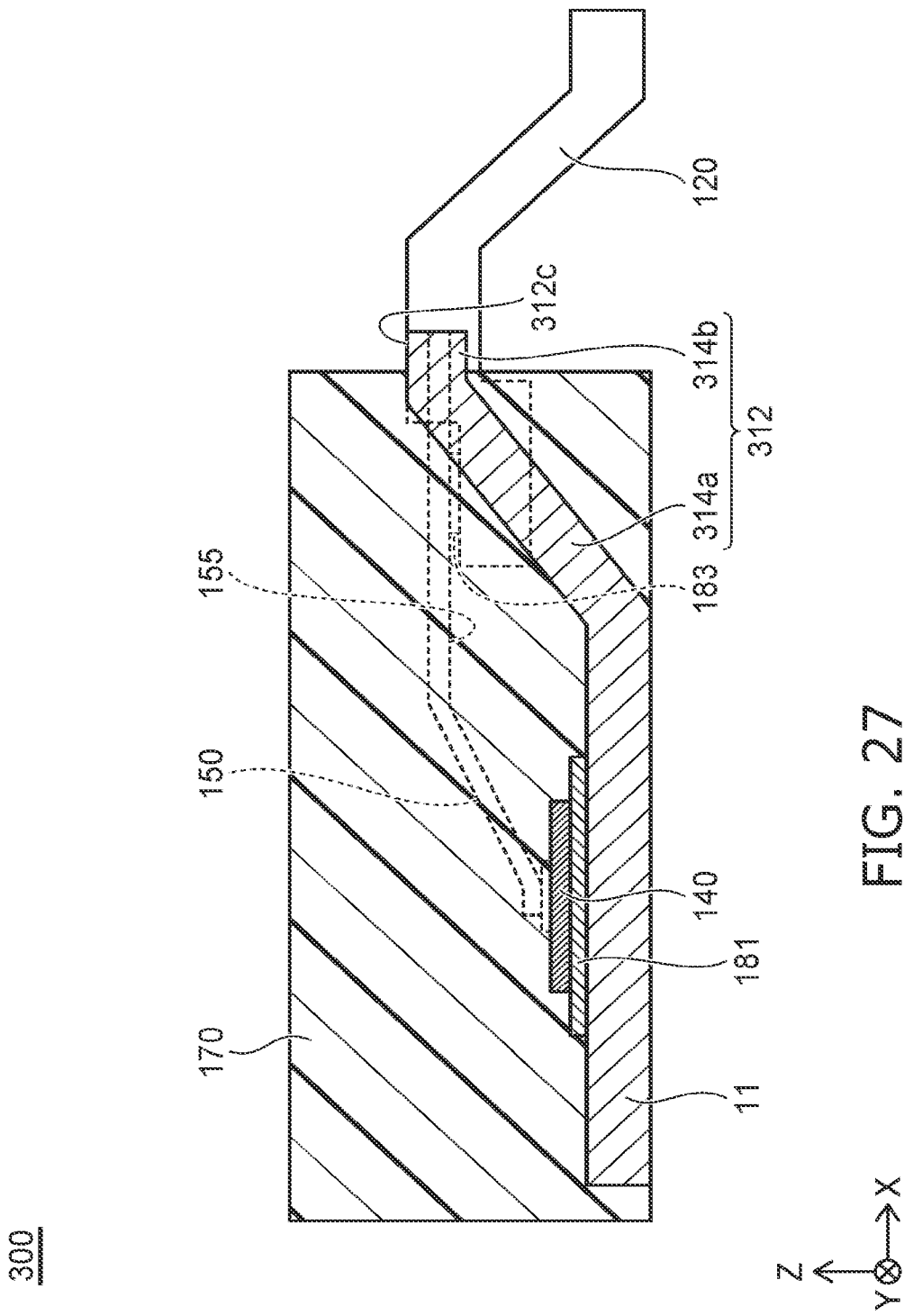
FIG. 27 is an end view along line F-F of FIG. 26.

FIG. 27 is an end view along line F-F' of FIG. 26.

In the semiconductor device 300 thus manufactured, as shown in FIG. 26, a protruding part 312 is formed of the first extension part 314a and a portion of the second extension part 314b of the fourth part 314. As shown in FIG. 27, the lower surface 155 of the first conductive member 150 that is connected to the bonding member 183 is positioned lower than an upper surface 312c of the portion of the protruding part 312 exposed outside the sealing member 170.

Effects of the embodiment will now be described.

In the embodiment, by disposing the connector member 20 at the step 316 provided in the fourth part 314, the connector member 20 engages the fourth part 314 in the process of bonding the connector member 20. Therefore, the misalignment of the connector member 20 with respect to the leadframe 310 can be suppressed in at least two directions.

The second and third embodiments may be combined, and the connector member and the fourth part may be caused to engage each other by providing a pair of steps in the connector member and providing a step in the fourth part of the leadframe.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions. Additionally, the embodiments described above can be combined mutually.

What is claimed is:

1. A method for manufacturing a semiconductor device, the method comprising:
   fixing a semiconductor chip to a first part of a leadframe;
   bonding one connector member to a first terminal of the semiconductor chip, a second terminal of the semiconductor chip, a second part of the leadframe, and a third part of the leadframe;
   forming a sealing member to
      cover the semiconductor chip, a bonding part of the connector member with the first terminal, a bonding part of the connector member with the second terminal, a bonding part of the connector member with the second part, and a bonding part of the connector member with the third part, and
   leave a portion of the connector member and a portion of the leadframe exposed; and
   separating a first conductive part of the connector member and a second conductive part of the connector member by removing at least a section of the portion of the connector member exposed outside the sealing member, the first conductive part being bonded to the first terminal and the second part, the second conductive part being bonded to the second terminal and the third part.

2. The method according to claim 1, wherein
the bonding of the connector member includes:
   disposing solder between the first terminal and the connector member, between the second part and the connector member, between the second terminal and the connector member, and between the third part and the connector member; and
   heating the solder inside a reflow furnace.

3. The method according to claim 1, wherein
in the bonding of the connector member, the connector member contacts a fourth part of the leadframe in one direction, and
the fourth part is positioned between the second part and the third part.

4. The method according to claim 3, wherein
the connector member and the fourth part engage each other in the bonding of the connector member.

5. The method according to claim 4, wherein
the connector member engages the fourth part in the bonding of the connector member by being disposed in a step provided in the fourth part.

6. The method according to claim 4, wherein
the fourth part engages the connector member in the bonding of the connector member by being disposed between a pair of steps provided in the connector member.

* * * * *